United States Patent
Ionescu et al.

(10) Patent No.: US 8,031,793 B2
(45) Date of Patent: *Oct. 4, 2011

(54) APPARATUS USING CONCATENATIONS OF SIGNAL-SPACE CODES FOR JOINTLY ENCODING ACROSS MULTIPLE TRANSMIT ANTENNAS, AND EMPLOYING COORDINATE INTERLEAVING

(76) Inventors: Dumitru Mihai Ionescu, Dallas, TX (US); Tony Reid, Plano, TX (US)

( * ) Notice: Subject to any disclaimer, the term of this patent is extended or adjusted under 35 U.S.C. 154(b) by 1848 days.

This patent is subject to a terminal disclaimer.

(21) Appl. No.: 11/039,274

(22) Filed: Jan. 19, 2005

(65) Prior Publication Data

US 2006/0159195 A1    Jul. 20, 2006

(51) Int. Cl.
*H04B 7/02* (2006.01)
(52) U.S. Cl. ........................................ 375/267
(58) Field of Classification Search .................. 375/267, 375/260, 259, 295, 299, 316, 347
See application file for complete search history.

(56) References Cited

U.S. PATENT DOCUMENTS

| | | | | |
|---|---|---|---|---|
| 6,158,041 A * | 12/2000 | Raleigh et al. | ................ | 714/792 |
| 2001/0009569 A1 * | 7/2001 | Kang et al. | .................... | 375/242 |
| 2001/0034868 A1 * | 10/2001 | El-Gamal et al. | ............ | 714/755 |
| 2002/0122502 A1 * | 9/2002 | El-Gamal et al. | ............ | 375/267 |
| 2003/0021355 A1 * | 1/2003 | You | .............. | 375/267 |
| 2003/0028843 A1 * | 2/2003 | Chang et al. | ................ | 714/786 |
| 2003/0043928 A1 * | 3/2003 | Ling et al. | ..................... | 375/267 |
| 2004/0002364 A1 * | 1/2004 | Trikkonen et al. | ......... | 455/562.1 |
| 2004/0240401 A1 * | 12/2004 | Willenegger et al. | ......... | 370/294 |
| 2005/0152265 A1 * | 7/2005 | Denk | ............................ | 370/209 |
| 2006/0034381 A1 | 2/2006 | Ionescu et al. | ................ | 375/267 |
| 2006/0034386 A1 | 2/2006 | Vummintala et al. | ......... | 375/267 |

FOREIGN PATENT DOCUMENTS

WO    WO 03075467 A1 *    9/2003

OTHER PUBLICATIONS

Kim et al, Quasi-Complementary Turbo Codes (QCTC) for Applications in High-Data-Rate Systems, Vehicular Technology Conference, 2003, Apr. 22-25, 2003, pp. 2381-2385.*

Huang et al., "16-QAM BICM-ID in Fading Channels with Imperfect Channel State Information", Sep. 2003, IEEE Transactions on Wireless Communications, vol. 2, No. 5, pp. 1000-1007.

(Continued)

*Primary Examiner* — Kevin M Burd
(74) *Attorney, Agent, or Firm* — Harrington & Smith

(57) ABSTRACT

A system for transmitting data over a MIMO channel has a transmitter and a receiver. In the transmitter, the input data is encoded over at least two pipes by a concatenation of at least two constituent signal-space encoders. Each constituent encoder is used to generate, in response to the input data, a sequence of symbols from a channel alphabet having at least one dimension. Each symbol of the channel alphabet includes at least one complex symbol having real and imaginary coordinates. The transmitter interleaves the coordinates of the sequence of channel alphabet symbols, and transmits (from at least two transmit antennas) the interleaved coordinates. Preferably, each constituent encoder maximizes a minimum coordinate-wise Hamming distance between members of all valid pairs of symbol sequences, maximizes a minimum Euclidean distance between members of all valid pairs of different codewords, and obeys an equal eigenvalue criterion.

24 Claims, 8 Drawing Sheets

OTHER PUBLICATIONS

Furió et al., "Rotated TCM Systems with Dual Transmit and Multiple Receive Antennas on Nakagami Fading Channels", Oct. 2002, IEEE Transactions on Communications, vol. 50, No. 10, pp. 1609-1616.

Ariyavisitakul, S.L., "Turbo Space-Time Processing to Improve Wireless Channel Capacity", 2000, IEEE 0-7803-6283-7/00, pp. 1238-1242.

Chindapol et al., "Design, Analysis, and Performance Evaluation for BICM-ID with Square QAM Constellations in Rayleigh Fading Channels", May 2001, IEEE Journal on Selected Areas in Communications, vol. 19, No. 5, pp. 944-957.

Boutros et al., "Signal Space Diversity: A Power- and Bandwidth-Efficient Diversity Technique for the Rayleigh Fading Channel", Jul. 1998, IEEE Transactions on Information Theory, vol. 44, No. 4, pp. 1453-1467.

Bali et al., "Block-Coded PSK Modulation Using Two-Level Group Codes Over Dihedral Groups", Jul. 1998, IEEE Transactions on Information Theory, vol. 44, No. 4, pp. 1620-1631.

Jeličić et al., "Design of Trellis Coded QAM for Flat Fading and AWGN Channels", Feb. 1994, IEEE Transactions on Vehicular Technology, vol. 44, No. 1, pp. 192-201.

Giraud et al., "Constellations Designed for the Rayleigh Fading Channel", ISSI conference (believed to be 1993), 1 page.

Cui D. et al., "Performance of Parallel Concatenated Space-Time Codes", IEEE Communications Letters, vol. 5, No. 6, Jun. 2001, pp. 236-238.

Hong, Y. et al., "Space-Time Turbo Trellis Codes to Two, Three and Four Transmit Antennas", IEEE Transactions on Vehicular Technology, vol. 53, No. 2, Mar. 2004, pp. 318-328.

Van De Beek, J. et al., "Benefits of Modulation Diversity in Turbo-Coded OFDM Systems", © 2004 IEEE, pp. 929-933.

* cited by examiner

APPARATUS USING CONCATENATIONS OF SIGNAL-SPACE CODES FOR JOINTLY ENCODING ACROSS MULTIPLE TRANSMIT ANTENNAS, AND EMPLOYING COORDINATE INTERLEAVING

RELATED APPLICATION

This application is related to copending U.S. patent application Ser. No. 10/918,533, filed on Aug. 12, 2004, the contents of which are incorporated in their entirety.

TECHNICAL FIELD

The field of the invention is wireless communications, in particular multiple-antenna transmissions.

BACKGROUND OF THE INVENTION

Various schemes have been explored to improve wireless transmission, in particular mobile telephony. In current practice, workers in the field employ systems that transmit data simultaneously along a number of channels, issuing from two or more transmit antennas and being received in one or more receive antennas.

Modulated wireless signals from a transmitter reach a receiver by a number of propagation paths. The characteristics of each propagation path vary over time and between one another subject to factors such as fading, multipath, and different signal to interference and noise ratio (SINR). Multiple transmit and/or receive antennas may be used to provide diversity that insures against adverse effects on any of these paths, because the likelihood of correctly receiving a transmission increases with the number of transmit antennas so long as one propagation path is not merely a (linear) combination of the others. This diversity-oriented approach accommodates both space-time coding and space-frequency coding, as well as a mix thereof (sometimes called space-frequency-time coding), and may include knowledge of channel state at the transmitter. This approach is fully realizable with only one receiver antenna, and additional receiver antennas may be simply used to add receiver diversity gain, or to facilitate capacity improvements.

While multiple receive and/or multiple transmit antennas—giving rise to multiple input multiple output (MIMO) channels—have been successfully employed to enhance diversity, they also allow a substantial increase in communication capacity as compared to non-MIMO systems. Under certain conditions, that increase is linearly related to the number of transmit or receive antennas. The resulting MIMO channel may be considered as a number of independent channels, the number being at most the number of transmit antennas. Each of the independent channels is also referred to as a spatial subchannel of the overall MIMO channel, and corresponds to one spatial dimension.

A bit sequence is sent by modulating a signal, according to constellation points, onto either a single carrier wave to assume discrete values of a signal parameter, or a set of subcarriers, in the case of orthogonal frequency division multiplexing (OFDM). While increasing the number of available constellation points allows increased data rates over a given bandwidth, the increase necessarily increases error frequency at the decoder because adjacent constellation points are closer in proximity to one another as compared to a constellation with fewer points. Trellis coded modulation (TCM) is one coding technique wherein modulation and coding are combined in a manner that reduces error rate by restricting transitions between adjacent constellation points, and thereby avoiding bandwidth expansion. Other coding techniques employ block coding, and include low-density parity check (LDPC) codes.

In an uncoded system, the relevant minimum distance between adjacent constellation points is merely the Euclidean distance. A fundamental concept of TCM systems is that transitions between adjacent constellation points are not allowed during the process of adding redundancy for the purpose of forward error correction. TCM systems allow transitions only between non-adjacent points, so that the minimum Euclidean distance between points in an allowed transition, is greater than the Euclidean distance between two nearest adjacent points. TCM systems can thus increase coding gain without increasing bandwidth.

Regarding the use of coded modulation in fading channels, conventional use of TCM (alone, or via an outer TCM and a concatenated inner code) have proven unable to achieve a diversity order of more than about three in fast fading environments, and more than about five in space-time bit interleaved coded modulation schemes. What is needed in the art is a method and apparatus to increase or maximize the diversity order in a fast fading environment, especially using multiple transmit antennas, across which coding may be performed simultaneously, or jointly. Prior art solutions using bit interleaved coded modulation schemes dispose an interleaver between an encoder and modulator, which separates coding from modulation, and undermines certain capacity advantages attainable by using multiple transmit antennas.

These and other features, aspects, and advantages of embodiments of the present invention will become apparent with reference to the following description, and in conjunction with the accompanying drawings. It is to be understood, however, that the drawings are designed solely for the purposes of illustration and not as a definition of the limits of the invention.

SUMMARY OF THE INVENTION

The invention relates to a wireless system that employs a concatenation of signal-space codes for transmission by multiple antennas in such a way as to enable iterative detection and decoding.

A feature of the invention is the interleaving of the coordinates of the complex values of the transmitted, possibly multidimensional, constellation points produced by the operation of a signal space encoder, rather than interleaving the output of the encoder, such that each complex symbol may be reconstructed from the deinterleaved coordinates at the receiver.

A feature of the invention is that the codes employed in the transmission are "signal-space" codes that map information symbols (bits) directly to symbols from the channel alphabet (complex values) rather than coded symbols from a finite field alphabet.

Another feature of the invention is the construction of an apparatus for concatenating two or more recursive and systematic signal space codes for encoding data both over at least one of time and over a plurality of transmit antennas, in such a manner as to accommodate the use of a coordinate interleaving scheme for the concatenated code.

Another feature of the invention is that serial iterations between detector and decoder are capable of providing and refining extrinsic information on individual coordinates.

The invention is in one aspect a method for transmitting data over multiple channels. The method includes encoding input data over at least two pipes by a concatenation of at least two constituent signal-space encoders. Each constituent encoder is used to generate, in response to the input data, a sequence of symbols from a channel alphabet. Each symbol of the channel alphabet has at least one complex symbol having real and imaginary coordinates. Further in the method, the coordinates of the sequence of channel alphabet symbols are interleaved into codewords that are disposed in transmission frames. The frames are transmitted from at least two transmitting antennas.

The invention is in another aspect a method for decoding data received over multiple channels, where the data is characterized by a concatenated and coordinate-interleaved structure. This method includes demodulating received data, passing the demodulated data through a first decoder to form an intermediate output, and deinterleaving coordinates of the intermediate output to generate a plurality of streams of extrinsic information pertaining to the deinterleaved coordinates. Further in the method, at least one of the plurality of streams and a feedback stream from another of a plurality of decoders is input into each of the plurality of decoders, and the feedback streams are permuted to derive compatible feedback signals.

The invention is in another aspect a transmitter, that includes a joint encoder, a coordinate interleaver, and at least two transmit antennas. The joint encoder includes at least two constituent signal-space encoders, and encodes input data over at least two pipes by concatenating outputs from the at least two constituent signal-space encoders. Each of the constituent encoders is used to generate a sequence of symbols from a channel alphabet having at least one dimension, where each symbol of the channel alphabet has at least one complex symbol having real and imaginary coordinates. The coordinate interleaver has an input coupled to an output of the joint encoder, and is for interleaving the coordinates of the sequence of channel alphabet symbols. The transmit antennas each have an input coupled to an output of the coordinate interleaver, and are for transmitting the interleaved coordinates from the sequence of channel alphabet symbols.

The invention is in another aspect a receiver for decoding data received over multiple channels, where the data is characterized by a concatenated and coordinate-interleaved structure. The receiver includes antennas, a demodulator, a serial decoder, at least two parallel decoders (decoders in parallel with one another), and a calculating module. At least two antennas are for receiving data over multiple channels. The demodulator has an input coupled to an output of the antennas. The serial decoder is for decoding an inner code and has as inputs an output of the demodulator. The parallel decoders each have a first input coupled to an output of the first decoder and a feedback input coupled to a feedback output of another parallel decoder. Each parallel decoder operates to deinterleave coordinates of that parallel decoder's respective first input to decode an outer code thereof, and each parallel decoder further has a second output. The calculating module has inputs coupled to each of the second outputs of the parallel decoders, and an output coupled to the serial feedback of the serial decoder.

The invention is in another aspect an apparatus for transmitting data over multiple channels. This apparatus has means for encoding and concatenating input data over at least two pipes by generating, from the input data, a sequence of channel alphabet symbols, each symbol including at least one complex symbol having real and imaginary coordinates. The apparatus also has means for interleaving the coordinates of the sequence of symbols into codewords that each comprise a transmission frame. It further has means for transmitting the frames from at least two transmitting antennas.

The invention is in another aspect an apparatus for operating on data received over multiple channels, where the data is characterized by a concatenated and coordinate-interleaved structure. This apparatus has means for receiving data over multiple channels (such as receive antennas), means for demodulating the received data (such as a demodulator), and means for decoding an inner code of the demodulated received data using information about interleaved coordinates (such as a calculating module as detailed herein). It also has means for deinterleaving coordinates that are output from the means for decoding an inner code, and parallel means for decoding an outer code of the demodulated received data, each of said parallel means using a feedback from another of said parallel means for decoding an outer code. Preferably, the deinterleaving and parallel decoding are embodied in parallel SISO (soft input-soft output) modules that iteratively decode. The apparatus further has means for determining extrinsic probabilities of an outer code of the received data from outputs of each of the parallel means. The extrinsic probabilities are provided as an output that is coupled to an input of the means for decoding an inner code.

The invention is in another aspect a program of machine-readable instructions, tangibly embodied on an information bearing medium and executable by a digital data processor, to perform actions directed toward transmitting a stream of input data. In this aspect, the actions include encoding input data over at least two pipes by a concatenation of at least two constituent signal-space encoders, in which each constituent encoder is used to generate, in response to the input data, a sequence of symbols from a channel alphabet having at least one dimension, each symbol of the channel alphabet including at least one complex symbol having real and imaginary coordinates. The actions further include interleaving the coordinates of the sequence of channel alphabet symbols into codewords that comprise transmission frames, and transmitting the frames from at least two transmit antennas.

Further details are presented below.

BRIEF DESCRIPTION OF THE DRAWINGS

In FIG. 5A, the interleaving of the information sequence is done symbol wise with respect to the input of the second constituent encoder; here, symbol refers to one input symbol for the second constituent encoder, where an input symbol is formed as a group of $k_0 > 1$ information bits.

DETAILED DESCRIPTION

Figures 1, 2:
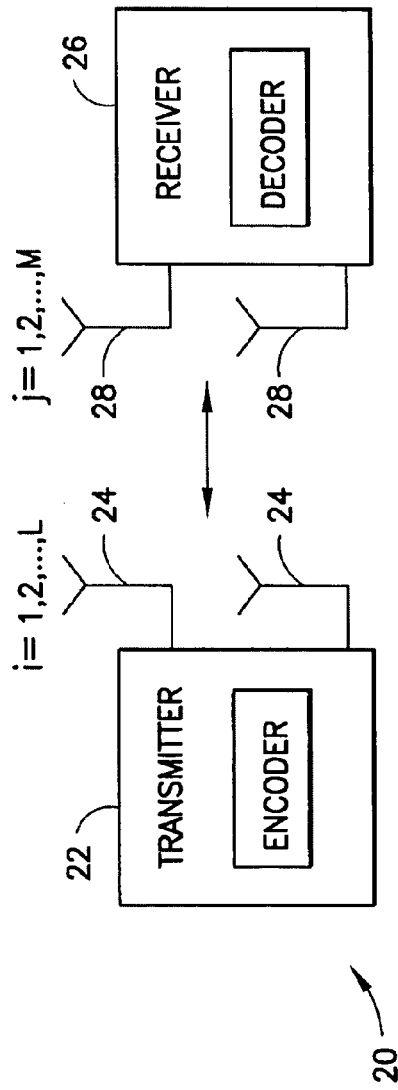
FIG. 1 is a block diagram showing a wireless MIMO communication system in which the present invention operates most advantageously, where the encoder block represents a concatenated encoder, such as a parallel concatenation of at least two systematic and recursive signal space encoders for multiple transmit antennas, said concatenation employing interleaving of the information symbols for all but possibly one of the parallel concatenated constituent encoders.
FIG. 2 shows a table of real and imaginary coordinates collected post encoding and modulation via a parallel concatenation of two systematic (and recursive) encoders, where said coordinates are to be subsequently interleaved over fifteen (in this example) complex symbol epochs (or channel uses, either time domain or frequency domain) and across two transmit antennas. The coordinates being collected are the coordinates originating in the systematic part of the first constituent encoder (subscript 'x'), the parity check part of the first constituent encoder (subscript 'y'), and the parity check part of the second constituent encoder (subscript 'yp'). If only one constituent encoder were present (i.e., no parallel concatenation), then the entries subscripted 'yp' would be absent.

Below, we distinguish between information interleaving and coordinate interleaving; the former is well understood in the art ("turbo" codes), and acts on the information sequence (e.g., unencoded bits), while the latter, explained in more detail in the sequel, operates on the coordinates of the complex sequence that results from encoding and modulation.

The present invention is in one aspect a method for transmitting, with both increased diversity and coding redundancy in fading channels as compared to prior art methods, an input signal from a plurality of transmit antennas, after concatenation of at least two signal space encoders for multiple transmit antennas—such as a parallel concatenation of at least two systematic and recursive signal space encoders for multiple transmit antennas that employs interleaving the information symbols for all but possibly one of the parallel concatenated encoders. The method is explained with reference to example(s) that include jointly encoding, over at least two pipes (pipes including, but not limited to, space, time, frequency, or spreading code), concatenating at least two encoders for multiple transmit antennas, as well as puncturing and/or repetition to control the spectral efficiency of the overall scheme. The encoders or codes that are being concatenated are referred to as constituent codes, and in the case of parallel concatenation the constituent codes can be systematic and recursive signal space encoders for multiple transmit antennas. The codeword resulting from concatenation is subject to puncturing and repetition to control the overall spectral efficiency, and supplies a transmission frame defined as at least one complex symbol (such as, but not limited to, a symbol from a 4PSK constellation), thereby describing all of the complex values to be transmitted during all channel uses covered by the frame, from all constituent codes, after coordinate interleaving and, possibly, appropriate puncturing and repetition that affects the coordinates of the complex symbols eventually transmitted over the MIMO channel. Each complex symbol has a first and a second coordinate. The coordinates collected after the operation of all constituent encoders are interleaved and punctured within the boundaries imposed by the frame, and the transmitted frame corresponds to a predesignated number of channel uses relevant to the concatenated encoder, such as arising from, but not limited to, a number of transitions through the entire trellises of trellis encoded constituent codes. Further redundancy (for purposes of forward error correction) is not necessarily added thereafter (by additional encoding steps), though it is not precluded by the invention. The method applies whether encoding and modulation occur at once (in the constituent encoders) or separately; in the former case, the resulting redundancy scheme associated with a constituent encoder is referred to as a signal-space code, or coset code, or lattice code, depending on the extent of the structure designed into the constituent encoder. In connection with complex symbols, the terminology 'first and second coordinates' refers to the in-phase and quadrature components, respectively. Following in the method, the interleaved first and second coordinates in the frame are transmitted from at least two transmit antennas, in general during different uses of the multiple input multiple output (MIMO) channel seen by the concatenated encoder/modulator subblock(s). Transmission from multiple transmit antennas can reflect the steps of encoding over multiple transmit antennas, preferably jointly, and/or the step of precoding (over multiple transmit antennas) with the purpose of eigen-beamforming—should the transmitter, in the latter case, have information about the channel state. Thereby, the present example accommodates any number of transmit antennas greater than one, including the use of some transmit antennas for precoding (beamforming), and is most advantageous when the first and second coordinates of each complex symbol—generated during the operation of the (concatenated) signal-space encoders—are each transmitted during the same or distinct times (channel uses) either from the same or from different transmit antennas. An important aspect of the invention is to insure that the first and second coordinates, when passing through the MIMO channel, experience different degrees of fading (channel magnitudes in a flat fading scenario), in such a way as to benefit from any relevant diversity that may be present in the MIMO channel.

Any particular transmission frame according to the present invention would typically carry coordinates from several complex symbols, the symbols generated by operation of a concatenated encoder and modulator; in turn, the encoder and modulator pertaining to a constituent code involved in concatenation are possibly combined into a signal-space encoder. Conceptually, the coordinates of each complex symbol generated by the concatenated encoder and modulator are separated from one another, leaving twice as many individual coordinates as complex symbols. The separated coordinates are then collected and possibly rearranged whereby consecutive individual coordinates are no longer paired in a manner that necessarily represents the complex symbols generated by any constituent aggregated encoder and modulator. The resulting collection of individual coordinates within a frame such as illustrated in FIG. 2 are interleaved, then reassembled into complex values so that any pair of coordinates that is transmitted over a single symbol epoch (e.g., a column of FIG. 2) from a single transmit antenna is unlikely to represent opposing coordinates of the complex symbol generated by the encoder-modulator aggregate for that particular antenna, symbol epoch, and constituent code. Note that the coordinates collected in a frame such as illustrated in FIG. 2 pertain to the scenario when the concatenated scheme is realized as a parallel concatenation of at least two systematic and recursive signal space encoders for multiple transmit antennas, whereby said concatenation employs interleaving the information symbols for all but possibly one of the parallel concatenated encoders, and whereby the collection of coordinates groups together the coordinates in the systematic part of the first constituent encoder (subscript 'x'), the parity check part of the first constituent encoder (subscript 'y'), and the parity check part of the second constituent encoder (subscript 'yp'). The receiver must de-interleave the individual coordinates (or soft information thereof) in order to re-assemble the complex symbols that were generated by the constituent encoder and modulator aggregates in the transmitter. Because coordinates of any single generated symbol are unlikely to be sent over the same symbol epoch or from the same transmit antenna due to the coordinate interleaving performed at the transmitter, they will experience different channel conditions.

Preferably, when trellis coded modulation is used to realize a constituent signal-space code, the encoding performed by any of the constituent encoders includes partitioning a, possibly multidimensional, signal constellation into a plurality of mutually exclusive cosets, the cosets selected to maximize a minimum Hamming distance between coordinates of points from the same coset, and/or a minimum Euclidean distance between points from the same coset. Preferably, too, a signal space encoder used by this method and apparatus is programmed to operate so as to insure that the labels of various trellis branches, the labels being matrices, are defined so as to obey an equal eigenvalue criterion, while maximizing a minimum coordinate-wise Hamming distance, and/or a minimum Euclidean distance between different codewords. The present invention applies to both unrotated and rotated constellations on the individual transmit antennas; rotation may favor increasing the minimum coordinate-wise Hamming distance, but the invention is not conditioned on rotation per se. For example, with two transmit antennas, a first sub-codeword that is at least one complex symbol from a first constellation may span a first subframe (first two rows in FIG. 2). A second sub-codeword that is at least one complex number from a second constellation may span a second sub-frame (last two rows in FIG. 2). The two (or more) non-overlapping sub-frames make up the transmission frame, which generally includes symbols from all constituent encoders. In the case of a parallel concatenation of two systematic and recursive constituent encoders, the non-overlapping sub-frames will contain coordinates originating in the systematic part of the first constituent encoder (subscript 'x'), the parity check part of the first constituent encoder (subscript 'y'), and the parity check part of the second constituent encoder (subscript 'yp'). The coordinates for the first and second sub-codewords/symbol sets are interleaved, in their respective sub-frames or in the overall transmission frame, then transmitted from the transmit antennas, possibly after puncturing and repetition. Thereafter, each antenna transmits coordinates from symbols that belong to one of the original constellations, or to more than one of the possibly different constellations, or to alternative constellations that resemble none of the original constellations.

In another aspect, the present invention is a method for transmitting an input signal, whereby the input signal is signal-space encoded via the concatenation of at least two trellis codes, whereby each constituent trellis encoder outputs, during each trellis transition, a possibly multidimensional TCM-encoded symbol composed of a set of at least one channel alphabet symbol, e.g. a complex symbol. Such output, in itself, represents one trellis transition. Coordinates of each complex constituent of the relevant sets of TCM-encoded multidimensional symbols are next collected from all constituent encoders, then interleaved over time, frequency, transmit antennas, or eigenbeams (should beamforming be employed when channel state information is known at the transmitter). The interleaving is within one frame, where one complete frame describes a complete path through the trellis of each constituent encoder, and thereby encompasses a predetermined number of trellis transitions from an arbitrary, possibly terminated, constituent code. The method then transmits the frame, which consists of the interleaved coordinates, from different transmit antennas or eigenbeams (should beamforming be used), possibly after an additional transformation such as an Inverse Discrete Fourier Transform (IDFT), in the case when orthogonal frequency division multiplexing (OFDM) is employed. It is also possible to puncture, or repeat, some of the (interleaved) coordinates, in order to control the overall code rate, or equivalently the spectral efficiency. This puncturing or repeating of certain coordinates may be performed prior to, or following, coordinate interleaving.

The present invention may also be embodied in a transmitter that uses a coset code, or a lattice code, which are alternative realizations of a signal-space code, as constituent codes in a concatenation. Such an embodiment includes, in relevant part, at least two (constituent) signal-space encoders, a coordinate interleaver, and at least a first and second transmit antennas. The concatenated encoder is for jointly encoding, across at least two pipes (e.g., time, space, frequency, spreading code), an input signal into a set of at least one complex symbols that span a frame, the frame defined as at least one complex symbol (such as, but not limited to, a symbol from a 4PSK constellation), and describing all of the complex values to be transmitted during all channel uses covered by the frame, as collected from all constituent codes, after coordinate interleaving and, possibly, after appropriate puncturing and repetition that affects the coordinates of the complex symbols transmitted over the MIMO channel. Thereby, a transmitted frame corresponds to a predetermined number of channel uses. Each complex symbol has a first and second coordinate. The modulating operation of a constituent signal space encoder is for adapting the encoding operation to the specific channel alphabet, e.g. 4PSK, and preferably comprises a multidimensional signal constellation wherein each multidimensional symbol is defined by at least two real coordinates (e.g., a complex matrix labeling a trellis branch). The coordinate interleaver has an input coupled to the outputs of the constituent encoder and modulator pairs (one output per constituent where the encoder and modulator are combined into a signal space encoder). The coordinate interleaver is for interleaving coordinates of the set of complex symbols within the frame, as collected from the outputs of all constituent encoders. The interleaved coordinates are assembled in a frame, which encompasses in the case of TCM a predetermined number of trellis transitions that applies equally to any of the constituent encoders. The two (or more) transmit antennas have inputs coupled to an output of the coordinate interleaver and together they transmit the frame, which includes the first and second interleaved coordinates, so that the interleaved coordinates are transmitted preferably at different times or channel uses, preferably from different transmit antennas, and possibly after subsequent precoding with the goal of eigenbeamforming.

The embodiment of a constituent encoder may also include a coset selector to partition a multidimensional signal constellation into cosets of multidimensional symbols realized from a set of at least one complex symbol; the multidimensional constellation is adequately sized to allow transmission, over multiple transmit antennas, of the symbols generated as a result of an encoding operation, where encoding is preferably performed jointly over multiple antennas. Preferably, this partitioning into cosets is done to control one or more performance parameters, such as diversity (e.g., slope of FEP/SNR curve) by maximizing a minimum Hamming distance with respect to coordinates, a minimum Euclidean distance, or to achieve additional encoding structure, such as obeying an equal eigenvalue criterion as known in the art. See, for example, D. M. Ionescu, *On Space-Time Code Design*, IEEE TRANS. WIRELESS COMMUN., pp. 22, January 2003; D. M. Ionescu, *New Results on Space-Time Code Design Criteria*, PROC. IEEE WIRELESS COMMUN. AND NETWORKING CONF., New Orleans, La., 1999, pp. 684-687; and H. F. Lu et al., *Remarks on Space-Time Codes Including A New Lower Round And An Improved Code*, IEEE TRANS. INFORM. THEORY, vol. 49, pp. 2752-2757, October 2003.

A constituent encoder based on a lattice or coset code, and used in the concatenation, further includes a signal space encoder and a modulator that together encode and modulate the input signal into a set of at least one complex symbol, where each complex symbol is a constituent of a multidimensional symbol, which in turn is a member of one of the cosets. The transmitter further has a coordinate interleaver, which has an input coupled to the outputs of the constituent encoding and modulation block pairs, in order to interleave first and second coordinates of a multitude of complex symbols from all constituent codes. The interleaved coordinates are assembled in a frame, which encompasses a predetermined number of trellis transitions. Further, the transmitter includes at least a first and a second antenna, each coupled to at least an output of the coordinate interleaver. Together, the first and additional antennas transmit the frame, which includes the first and second interleaved coordinates, so that the interleaved coordinates are transmitted preferably at different times or channel uses, preferably from different transmit antennas, and possibly after subsequent precoding with the goal of eigenbeamforming. Optionally, concerning the encoding and modulation operation, and any of the constituent codes, the inventive transmitter may employ a modulator that may be part of a space-time encoder or separate from a joint encoder, though in either case the output of the modulator, possibly of dimensionality greater than two, is coupled to the input of the coordinate interleaver.

In yet another aspect, for any of the constituent codes employed in concatenation, the present invention includes a method to increase a performance measure in a fading channel communication environment. This method can include partitioning a possibly multidimensional signal constellation into cosets in such a manner as to achieve additional encoding structure, such as obeying an equal eigenvalue criterion known in the art, or to control one or more meaningful measures of performance in a fading channel. The meaningful measures may be a maximized minimum Hamming distance between coordinates of complex constellation symbols, the magnitude of a negative exponent of a signal-to-noise ratio, a minimum Euclidean distance, or any other measures. This method also includes encoding and modulating an input signal into a set of at least one complex symbol from at least one constellation. Modulation may be employed jointly or separately with an encoding scheme, such as a space-time code or a low-density parity check code. Following encoding and modulation, as well as concatenation of the constituent encoders, the general method interleaves over time, (subcarrier) frequency, transmit antennas, and/or eigenbeams the real and imaginary coordinates of the complex symbols that are to be transmitted. This interleaving is done within a frame; in the case when a constituent encoder is realized via a trellis code, one complete frame encompasses a predetermined number of transitions that pass completely through a trellis diagram. The interleaved real and imaginary coordinates are conveyed to the receiver, after said interleaved coordinates are grouped so as to form new (post coordinate interleaving) complex values to be transmitted over the time-domain or frequency-domain MIMO channel—perhaps after an additional transformation such as IDFT, as the case would be in an OFDM scenario. In the case when a constituent encoder is realized as a trellis code, the actual frame is transmitted over a number of different channel uses (equally applicable to any of the constituent codes), which equals the number of transitions covered by a frame multiplied by the number of channel uses covered by a trellis transition—possibly adjusted so as to account for any puncturing and/or repetition, introduced with the goal of controlling the overall code rate or the spectral efficiency.

In yet another aspect, the present invention is a system for communicating over fading channels with high diversity, the system having a transmitter and a receiver. The transmitter has a plurality of constituent encoder and modulator pairs, each of which together encode and modulate, possibly after information interleaving, across at least two pipes (e.g., space, time, frequency, spreading code), an input signal into a set of at least one complex symbols that span a frame that corresponds to a predesignated number of channel uses, each complex symbol having a first and a second coordinate. A coordinate interleaver, having an input coupled to the outputs of the constituent encoder and modulator pairs, is for interleaving the coordinates of the set of at least one complex symbol within the frame, as collected from the outputs of all constituent encoders. The transmit antennas each have an input coupled to an output of the coordinate interleaver for transmitting the frame. In the system, the receiver has at least one receive antenna for receiving the frame over a multi-path channel, a coordinate de-interleaver having an input coupled to an output of the receive antenna for de-interleaving coordinates in the frame, a demodulator for demodulating the received frame, and a decoder for decoding the de-interleaved coordinates of the concatenated encoder. The receiver may also include a copy of the coordinate interleaver used in the transmitter, for the purpose of performing iterations between a demodulator (alternatively called a detector) and a decoder for the concatenated encoder.

In another aspect, the invention is a mobile station having a plurality of encoder and modulator pairs, each of which together encode and modulate, possibly after information interleaving, across at least two pipes (e.g., space, time, frequency, spreading code), an input signal into a set of at least one complex symbols that span a frame that corresponds to a predesignated number of channel uses, each complex symbol having a first and a second coordinate. The mobile station also has a coordinate interleaver having an input coupled to the outputs of the constituent encoder the modulator pairs for interleaving the coordinates of the set of at least one complex symbol within the frame, as collected from all constituent codes, possibly while repeating or puncturing coordinates in order to control the spectral efficiency. The mobile station further has at least a first and a second transmit antenna, each having an input coupled to an output of the coordinate interleaver for transmitting the frame.

FIG. 2 represents all the real coordinates that must be sent by the antennas during the transmission of a single codeword. More specifically, FIG. 2 pertains to the scenario when the concatenated scheme is realized as a parallel concatenation of at least two systematic and recursive signal space encoders for multiple transmit antennas, whereby said concatenation employs interleaving the information symbols for all but possibly one of the parallel concatenated encoders, and whereby the collection of coordinates groups together those coordinates originating in the systematic part of the first constituent encoder (subscript 'x'), the parity check part of the first constituent encoder (subscript 'y'), and the parity check part of the second constituent encoder (subscript 'yp'). If the encoder is actuated l times during a single codeword, and each time the encoder is triggered with k information bits, then there will be $2^{lk}$ codewords in the codebook (as well as in the codebook of any constituent code). Note that the coordinates themselves are interleaved, rather than the bits that make up (or are mapped to, should encoding and modulation be separated) coordinates.

Note that, in general, and referring to a constituent code, coordinate interleaving is different from bit interleaved coded modulation, and does NOT preclude (or destroy) the concept of coded modulation (via signal-space coding). This is so because coordinate interleaving operates on the real coordinates of the complex values from the complex modulator alphabet, rather than operating on the coded bits prior to the modulator. The coordinate interleaver of the present invention operates on the real coordinates of the complex symbols that are to be transmitted; that is, after the end result of encoding and modulation.

Figure 3A:
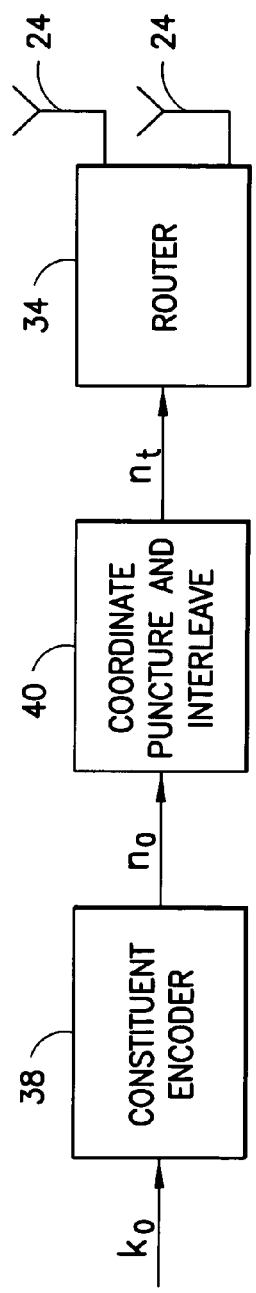
FIG. 3A is a block diagram showing relevant portions of a transmitter using signal space encoding to realize a constituent encoder as described above, followed by coordinate interleaving, and using at least one transmit antenna.
Figure 3B:
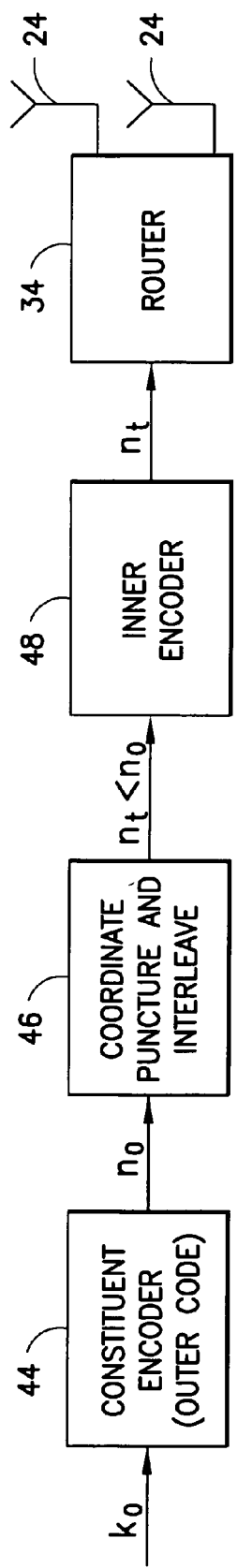
FIG. 3B is similar to FIG. 3A but showing an equivalent constituent encoder as a serial concatenation between an outer and inner code; the inner code has one state and rate one, thereby introducing no redundancy, but simply serving as an auxiliary representation for the purpose of defining the receiver for one of the constituent encoders used in the concatenation.

In an exemplary implementation, a constituent space-time signal space code with coordinate interleaving can be represented as in FIGS. 3A and 3B. A signal space encoder (or signal space code) is an encoder whose encoded output uses the symbols from a channel alphabet (i.e., complex values in wireless channels) rather than some intermediate finite alphabet (e.g., coded bits) that would be subsequently mapped to channel alphabet 'letters'. In a signal space code, the redundancy step and modulation step are combined by virtue of the code's construction. There is no way of inserting an interleaver between the encoding step (redundancy) and the modulation step, while preserving the signal space encoding nature. This means that, in general, one cannot implement bit interleaved coded modulation with a signal space code. Generally, as is known in the art for a transmitter, a number $k_0$ of unencoded bits (per trellis transition) are input into a constituent trellis encoder of rate $k_0/n_0$. In this exemplary embodiment, the constituent encoder implements a geometrically uniform, recursive, systematic space-time signal-space code. In the case of a quaternary alphabet on the individual transmit antennas, e.g., 4PSK, the $n_0$ encoded elements (coded bits) correspond to as many real coordinates in the modulated (complex) sequence. The $n_0$ coordinates are then input to a router for dispersion among the two transmit antennae.

FIG. 3A is a block diagram of relevant portions of a transmitter 36 according to a first embodiment of the invention that uses a signal space constituent encoder defined by a trellis. A number $k_0$ of unencoded bits (per trellis transition) are input into a signal-space encoder 38 of rate $k_0/n_0$. The signal-space encoder 38 may be a modulator and a separate encoder, or a combined modulator/encoder. It is noted also that the encoder section of the signal-space encoder 38 can be a space-time encoder, in order to take advantage of encoding over more than one antenna, as is the case in the preferred embodiment. The signal-space encoder 38 of FIG. 3A uses a generalized recursive systematic space-time coset code. For each $k_0$ unencoded bits, the $n_0$-coordinate output of the signal-space encoder 38 is then a series of complex numbers, which can be viewed as a series of encoded and modulated bits. In 4PSK modulation, each encoded bit corresponds, or is mapped, to a single coordinate of a complex symbol. In other modulations, the encoded bits are no longer individually mapped to one of the $n_0$ coordinates. The output of the encoder 38 is input into a coordinate interleaver 40. Preferably, puncturing or repetition is also used, so the interleaver module 40 both punctures/repeats and interleaves coordinates. Interleaving of coordinates is performed after encoding and modulation, though additional encoding may be performed after interleaving, beyond what is illustrated in FIG. 3B. A router 34 distributes the resultant signal among the two transmit antennae 24.

Consider the scenario where the number of transmit 24 and, respectively, receive 28 antennas (see FIG. 1) are L and M. Conditioned on knowledge of the channel state information (CSI) at the receiver, the probability of the transmitter 22 transmitting $$e=[e_0^{(1)}e_0^{(2)}\ldots e_0^{(L)}e_1^{(1)}\ldots e_1^{(L)}\ldots e_{l-1}^{(1)}\ldots e_{l-1}^{(L)}]^T \quad (1)$$

and the receiver 26 deciding in favor of $$c=[c_0^{(1)}c_0^{(2)}\ldots c_0^{(L)}c_1^{(1)}\ldots c_1^{(L)}\ldots c_{l-1}^{(1)}\ldots c_{l-1}^{(L)}]^T \quad (2)$$

at a maximum likelihood decoder is bounded as below, wherein $Pr\{\bullet\}$ represents probability and d represents the Hamming distance:

$$Pr\{c \mapsto e|\alpha_{i,j}[k], i=1,\ldots L; j=1,\ldots M; k=0,\ldots l-1\} \leq \exp(-d_E^2(e,c)E_s/4N_0). \quad (3)$$

In equation (3), the key parameter is:

$$d_E^2(e,c) = \sum_{j=1}^{M}\sum_{k=0}^{l-1}\left|\sum_{i=1}^{L}\alpha_{i,j}[k](c_k^{(i)}-e_k^{(i)})\right|^2. \quad (4)$$

It is known that $$d_E^2(e,c) = \sum_{j=1}^{M}\sum_{k=0}^{l-1}\Omega_j[k]C[k]\Omega_j^H[k], \quad (5)$$

where superscript "H" represents conjugated transposition, $$\Omega_j[k]=[\alpha_{1,j}[k],\ldots,\alpha_{L,j}[k]], \quad (6)$$

$$C[k] = (c_k-e_k)(c_k-e_k)^\perp = \begin{bmatrix} c_k^{(1)}-e_k^{(1)} \\ c_k^{(2)}-e_k^{(2)} \\ \vdots \\ c_k^{(L)}-e_k^{(L)} \end{bmatrix}[(c_k^{(1)}-e_k^{(1)})^*,\ldots,(c_k^{(L)}-e_k^{(L)})^*], \quad (7)$$

where superscript * indicates complex conjugation and $\alpha_{i,j}$ represent channel coefficients.

Since C[k] is Hermitian (its conjugated transposed matrix equals itself), it admits the singular value decomposition (SVD)

$$C[k]=V[k]D[k]V^H[k] \quad (8)$$

where the superscript 'H' indicates a Hermitian operation (complex conjugated transposition). The term $D_{ii}[k]$, $1 \leq i \leq L$, indicates the diagonal elements of D[k], which is diagonal per SVD transform; L is the number of transmit antennas. The vector $\Omega^{j[k]}$ of relevant channel coefficients (to receive antenna j) is transformed by virtue of the SVD into $$[\beta_{1,j}[k], \ldots, \beta_{L,j}[k]] = \Omega_j[k]V[k]. \quad (9)$$

The channel $\beta_{1,j}[k]$ describes the channel adequately for purposes of the abbreviated mathematical proof shown herein. Because V[k] (arising from the SVD of C[k] in equation 8) is unitary, the independent complex Gaussian random variables $\alpha^{1,j}[k], \ldots, \alpha^{L,j}[k]$ are transformed into a new set of L independent and identically distributed random variables. In other words, there exists an equivalent set of channels $\beta_{1,j}[k], \ldots, \beta_{L,j}[k]$ that characterizes the transmission. Therefore, for each channel use k, and each receive antenna j, $$\Omega_j[k]C[k]\Omega_j^+[k] = \sum_{i=1}^{L} |\beta_{i,j}[k]|^2 D_{ii}[k]. \quad (10)$$

By definition, C[k] has rank 1 (that is, if the set $c_k^{(1)}$, $c_k^{(2)}, \ldots, c_k^{(L)}$ is different from $e_k^{(1)}, e_k^{(2)}, \ldots, e_k^{(L)}$) thereby, exactly one value among $D_{1,1}[k] \ldots D_{L,L}[k]$, be it $D_{i_0 i_0}[k]$, is nonzero. The nonzero value must necessarily equal the trace of C[k], which in turn equals:

$$TrC[k] = \sum_{i=1}^{L} |c_k^{(i)} - e_k^{(i)}|^2 = \|c_k - e_k\|^2. \quad (11)$$

Consequently, the key parameter $d^2(c, e)$ reduces to $$\Omega_j[k]C[k]\Omega_j^+[k] = |\beta_{i_0,j}[k]|^2 D_{i_0 i_0}[k] = |\beta_{i_0,j}[k]|^2 \sum_{i=1}^{L} |c_k^{(i)} - e_k^{(i)}|^2. \quad (12)$$

The above shows that there exists an equivalent set of independent complex Gaussian channels derived from the original set of independent complex Gaussian channels, and exactly one of them $\beta_{i,j}$ affects all of the coordinates transmitted during channel use k. This means that, if the nonzero equivalent channel $\beta_{i,j}[k]$ fades, it will affect all 2L coordinates transmitted during the kth channel use. In the context of the present invention, the inventors have found that:

Theorem: There exists an equivalent set of independent complex Gaussian channels derived from $\alpha_{1,j}[k], \ldots, \alpha_{L,j}[k]$, such that exactly one of them affects all (real/imaginary) coordinates of a transmitted multidimensional point, $(c_k^{(1)}, \ldots, c_k^{(L)}) \in \Re^{2L}$, via $$\Omega_j[t]C[t]\Omega_j^+[t] = |\beta_{i_0,j}(t)|^2 \sum_{i=1}^{L} \left[(c_{t,I}^{(i)} - e_{t,I}^{(i)})^2 + (c_{t,Q}^{(i)} - e_{t,Q}^{(i)})^2\right]. \quad (13)$$

Taking the rightmost portion of the theorem equation immediately above, it is shown that the magnitude squared of the difference, between two possible codewords c and e that will be sent through an antenna i at channel use t, is dominated by the square of the relevant (equivalent) channel $\beta_{i_0,j}[t]$ itself. (The magnitude of $\beta_{i_0,j}$ is a real number that represents channel fade, and could be very small). At the receiver, this translates into the possibility that the decoder may not properly resolve between two potential constellation points, even where the constellation points are well separated.

The inventors have determined that coordinate interleaving effectively de-couples the magnitude squared of the difference between two possible codewords (the summed portion in the Theorem equation 13) from the minimizing effects of the channel (the magnitude squared multiplier in that equation). Returning to FIG. 2, each column represents a channel use t during transmission, and is thereby exposed to a certain channel magnitude. By scrambling the coordinates via coordinate interleaving, each coordinate goes through the channel at a different channel use t, so a $\beta_{i_0,j}[t]$ that is very small during one channel use will affect a set of coordinates (four in FIG. 2) that, after descrambling, are not all placed in the same transmission column, or in other words do not all belong to the same transition in the trellis. Consequently, even if some coordinates from a certain section (transition) through the trellis are demodulated less reliably at the receiver, chances are that some of the other demodulated coordinates that occur during that transition will have been exposed to less severe fading, and better assist the decoding (recovery) of that transition's label. The Theorem equation does not represent the embodiment of the invention, but is presented to prove the inventors' concept.

The inventors' Theorem above lead them to surmise that, regardless of the nature of the encoding and modulation operations, when using multiple transmit antennas and coded modulation possibly over nonbinary fields, with or without puncturing, diversity is increased by the following:

Interleave the coordinates of transmitted multidimensional constellation points in order to enable, and render meaningful, a Hamming distance with respect to coordinates, rather than with respect to complex symbols; and, Find codes for multiple transmit antennas that can maximize at least the minimum coordinate-wise (as opposed to complex-symbol-wise per current state of the art) Hamming distance between codewords (frames). Above, the meaning of "code" includes concatenated codes, as explained below, and may have one or more additional properties among, but not limited to: obeying an equal eigenvalue criterion, and/or maximizing a minimum Euclidean distance between different codewords (frames).

Concatenate two or more such codes, which will be referred to as constituent codes in the concatenation while interleaving the information sequence prior to applying it to each constituent encoder, and apply, to the concatenated encoder output, coordinate interleaving with optional puncturing and repetition. In particular, one can use a parallel concatenation of two systematic and recursive constituent encoders having one or more properties among, but not limited to: obeying an equal eigenvalue criterion, maximizing a minimum coordinate-wise Hamming distance between different codewords (frames), and/or maximizing a minimum Euclidean distance between different codewords (frames).

The first bullet, coordinate interleaving, is detailed above. The second can be resolved by a coset selector as part of a constituent encoder. Coset selectors are known in the art and are commercially available, typically embodied as a computer program on a medium that informs the encoder how to partition constellation points into cosets. In general, cosets are mutually exclusive subgroups that together include every member of a parent group (e.g., the entire symbol constellation). Clearly, interleaving coordinates per the first bullet above, as opposed to the bits that make up the coordinates, does not affect the Hamming distance spectrum in the codebook used by the encoder and decoder. The second bullet above is observed when the encoder operation is such that the successive selection of cosets and points thereof during successive trellis transitions is done in such a way as to achieve the largest minimum coordinate wise Hamming distance between competing paths through the encoder's trellis—given the constellations in use by the multiple transmit antennas, and regardless of whether constellation rotation is allowed or not (should all transmit antennas use the same constellation).

Note that, in general, coordinate interleaving is different from bit interleaved coded modulation, and does not preclude (or destroy) the concept of coded modulation (via signal-space coding). This is so because coordinate interleaving operates on the real coordinates of the complex values from the complex modulator alphabet, rather than operating on the coded bits prior to the modulator. The coordinate interleaver of the present invention operates on the complex coordinates of the symbol that is to be transmitted; that is, after the end result of encoding and modulation of the symbol.

Regarding the second bullet above, the presence of coordinate interleaving can be represented as in FIGS. 3A and 3B. FIG. 3A refers to one of the constituent codes, in particular to the case when a constituent code is realized via a trellis. In FIG. 3A, a number $k_0$ of unencoded bits (per trellis transition) are input into a constituent encoder 38 of rate $k_0/n_0$. The constituent, unconcatenated encoder 38 of FIG. 3A uses a possibly generalized, recursive, systematic, space-time, signal-space (or coset) code. The output of the encoder 38 is input into a coordinate interleaver 40. Optionally, in order to control the overall code rate, a puncturing code can also be used, so the interleaver module 40 interleaves and optionally punctures coordinates. The router demultiplexes the coordinates to the transmit antennas, and then, in a pass-band perspective, modulates them onto carrier waves. Likewise repetition of some coordinates can be used to vary the overall code rate below the rate of the (constituent) encoder 38.

FIG. 3B is similar to FIG. 3A, but showing an equivalent representation of the encoder, modulator, and coordinate interleaver as a serial concatenation between an outer code, an interleaver, and an inner code; the inner code has one state and rate one, thereby introducing no redundancy, but simply serving as an auxiliary representation of the embodiment in FIG. 3A for the purpose of justifying, and implementing, one embodiment of the receiver.

Figure 5A:
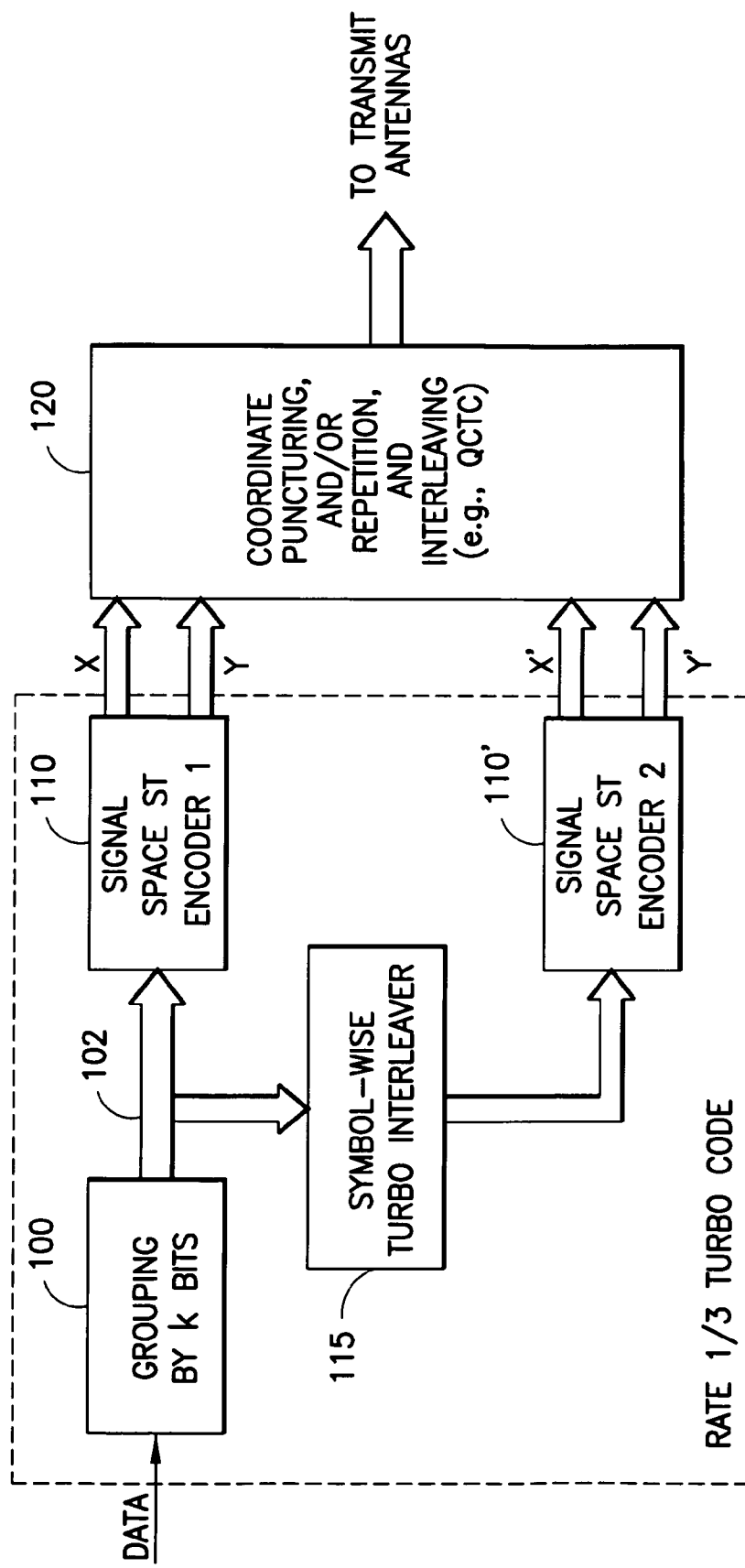
FIG. 5A shows a simplified block diagram of one embodiment of the invention that implements a concatenation of two or more constituent encoders. It represents a concatenated encoder, in the form of a parallel concatenation of at least two systematic and recursive signal space encoders for multiple transmit antennas, said concatenation employing interleaving of the information symbols for the second of the parallel concatenated constituent encoders.
Figure 5B:
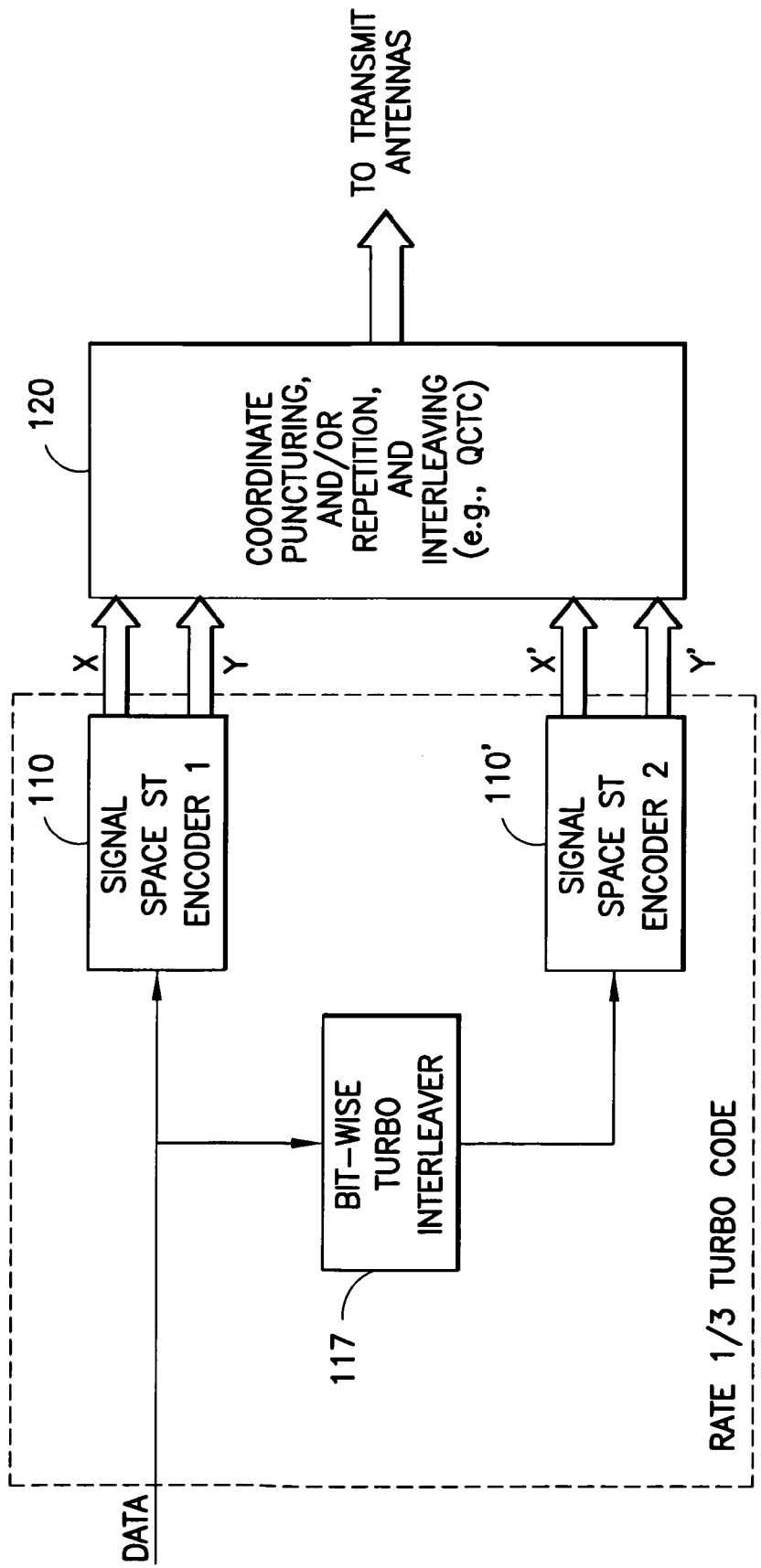
FIG. 5B represents an embodiment where the interleaving of the information sequence is done bit wise; that is, individual bits rather than symbols (groups of $k_0 > 1$ information bits) are interleaved before being applied to the input of the second constituent encoder.

Regarding the third bullet, as used herein, "concatenation" does not mean merely placing two things next to one another, but generally means using a plurality of constituent encoders to encode the same information sequence after interleaving it before all but one of the constituent encoders. FIG. 5 is one embodiment of concatenation, realized in the form of a parallel concatenation of at least two systematic and recursive signal space encoders for multiple transmit antennas, said concatenation employing interleaving of the information symbols for the second of the parallel concatenated constituent encoders. The outputs of encoding and modulating via multiple constituents provide real coordinates which are subsequently in the method, subject to coordinate interleaving, and possibly puncturing and/or repetition in order to control the spectral efficiency. In FIG. 5A, the interleaving of the information sequence is performed symbol wise with respect to the input of the second constituent encoder; here, "symbol" refers to one input symbol for the second constituent encoder, where an input symbol is formed as a group of $k_0>1$ information bits. FIG. 5B represents an embodiment where the interleaving of the information sequence is done bit wise; that is, individual bits rather than symbols (groups of $k_0>1$ information bits) are interleaved before being applied to the input of the second constituent encoder.

In FIG. 3B, $k_0$ bits are input into an encoder 44 that uses a possibly generalized, recursive, systematic space-time signal-space (or coset) code, which in this embodiment is considered an outer code. The output of this encoder 44 is input into a coordinate interleaver 46, which interleaves and optionally punctures coordinates as in FIG. 3A; the router demultiplexes the coordinates to the transmit antennas, and then, in a pass-band perspective, modulates them onto carrier waves. Those skilled in the art are aware that puncturing means that some of the coordinates associated with the collection of all complex symbols generated by the encoder's operation during a complete frame are deliberately not transmitted, in order to vary the overall code rate above the rate of the (constituent) encoder 44. Likewise repetition of some coordinates can be used to vary the overall code rate below the rate of the (constituent) encoder 44. The output from the interleaver module 46 is then viewed as being processed by a (virtual) inner signal-space encoder 48, which acts on coordinates (as input symbols), has one state, no memory, and operates during each transition on a number of elemental symbols (coordinates) that is no larger than $n_0$. The output of the trivial encoder 48 passes through a router 34 and is transmitted from the antennae 24. Those skilled in the art are aware that each of the coordinate interleavers 40, 46 is an appropriately selected permutation on a predetermined number of symbols from a concatenated symbol sequence, that can guarantee additional properties of the interleaved sequence of coordinates; such additional properties are for example, a minimal separation after permutation between two initially consecutive coordinates, or other preferred structure such as the arrangement in FIG. 2.

One important benefit of the present invention can be appreciated when viewing the encoder 38 followed by the coordinate interleaver 40 as a serial concatenation between an outer code (44, the actual space-time code), an interleaver, and a (virtual) single-state, unit-rate (i.e., degenerated) code. In this embodiment, the latter uses a subset (i.e., half) of the coordinates output by the outer code during one trellis transition (see FIGS. 3A-3B). This decouples the (two) channel uses covered by one trellis transition of the outer code, and allows maximum likelihood performance for the overall scheme to be approached via iterations on the serial concatenation shown in FIG. 3B.

The inventors have found that the very fact that the constituent inner encoder is non-binary allows the decoder for the degenerated inner code to generate non-zero extrinsic information during iterations; in other words, this serially-concatenated (turbo) view of the structure of a constituent code (enabled by the coordinate interleaver 46 and the inner code 48) enables the implementation, at the receiver, of iterations between demodulator (or detector) and decoder. If the inner code were binary (i.e., only one input symbol (i.e. a coordinate) is applied at its input at a time) then the extrinsic information on the single input symbol would be null; simply put, because the virtual inner code has only one state (no memory), no redundancy is present, and no soft information remains after subtracting the a priori information on the single input symbol from the soft information generated by a pass through a soft input soft output decoder, know in the art.

Conversely, if there are more that one input symbols applied to the inner code, then some coordinates carry soft information on other coordinates, even when there is no redundancy in the inner code itself, and the extrinsic information on any input symbol (coordinate) is nonzero.

Figure 4:
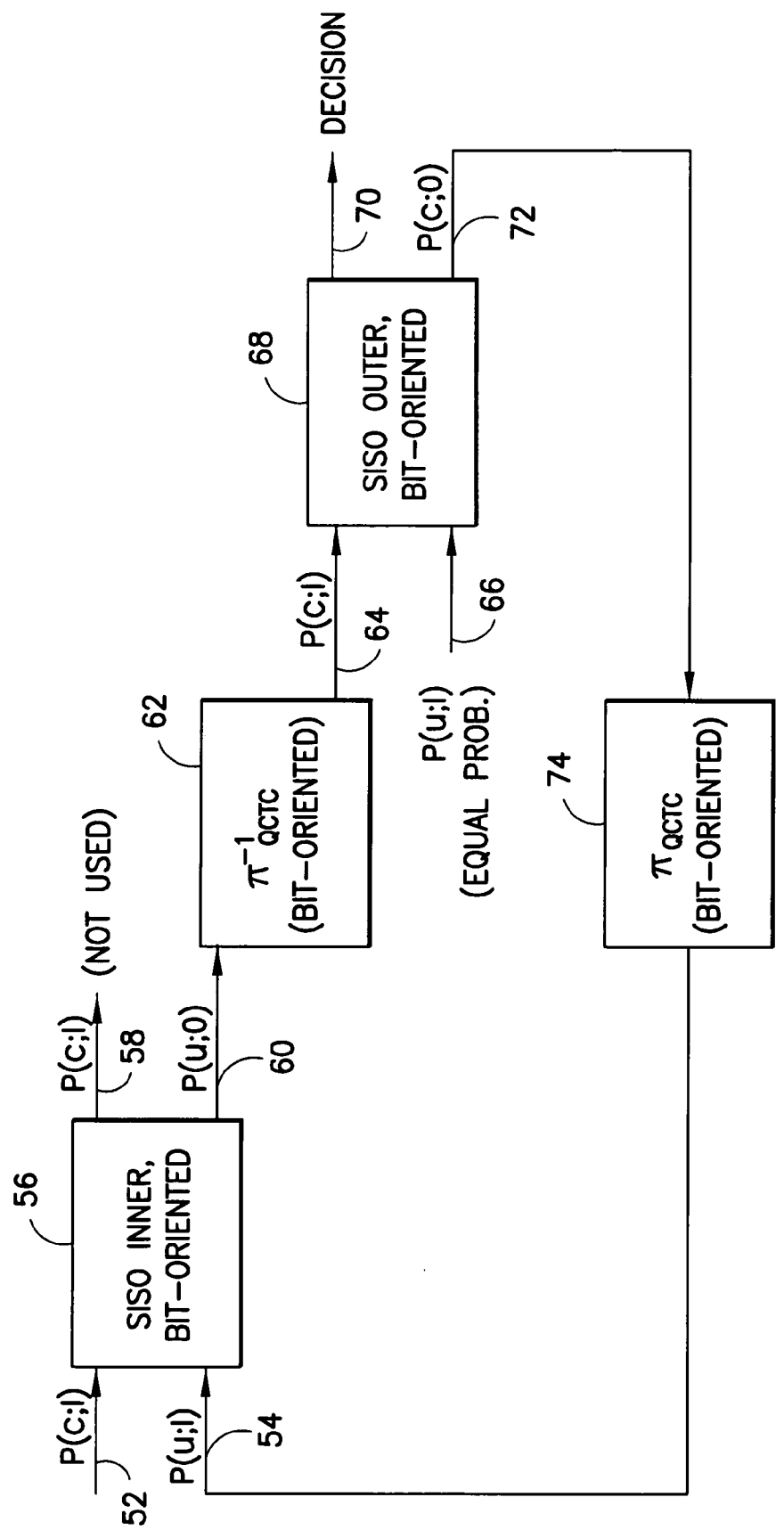
FIG. 4 is a block diagram of an iterative decoder that may be employed in a receiver in order to decode and de-interleave a signal received from a transmitter like that of FIG. 3B.

An exemplary implementation for an iterative receiver 50 for a stand-alone constituent signal-space code, in the presence of coordinate interleaving, is shown as FIG. 4. Such an iterative receiver implementation 50 is justified in conjunction with the transmitter 42 of FIG. 3B. Labels for the various signals input and output between functional blocks follow standard notation, where I and O following the parenthetical semicolon represents input and output, respectively; and c and u preceding the parenthetical semicolon represents either a priori or extrinsic information on the coded symbols and input (i.e., unencoded) symbols, respectively. Here, by symbols one understands either coordinates, in the context of block 48 and the output of block 44, or information bits in the context of the input to block 44. The a priori probabilities of the coded symbols, P(c;I), represented as input 52 of the soft input soft output (SISO) maximum a posteriori (MAP) probability calculator 56, are obtained from a demodulator (not shown). The block 56 is referred to as an inner SISO decoder block. Supplied at input 54 of the SISO decoder 56 are the a priori probabilities P(u;I) of uncoded information bits. Initially, during the first pass through the iterative structure in FIG. 4, the a priori probabilities supplied to input 54 are set (assumed) to be equal for each elemental symbol (coordinate) present at the $n_t$-coordinate input to block 48 (see FIG. 3B); in subsequent iterations, the a priori probabilities supplied to input 54 are obtained as extrinsic information about the same individual symbols (coordinates), as generated at output 72 by the SISO decoder 68 for the outer code 44, after passing through a feedback loop that permutes the extrinsic probabilities according to the permutation associated with the coordinate interleaver 46. The inner SISO decoder block 56, and all other blocks 62, 68, 74 within this iterative receiver 50 are coordinate-oriented; that is, they operate on elemental entities such as individual coordinates rather than on groups thereof, or symbols. The inner SISO decoder block 56 accepts the inputs 52 and 54, decodes the inner code (rate one, single state, no redundancy) used in the equivalent transmission chain (FIG. 3B) and outputs both P(c;O) 58, which is not used, and P(u;O) 60, which is extrinsic information on the input coordinates—which, in turn, represent output coordinates for the outer code (44 in FIG. 3B). The latter output, 60, is input into a de-interleave block where it is de-punctured and de-interleaved (consistent with the transmission). The output of the de-interleave block 62 is input P(c;I) 64 into a SISO decoder block 68 for the outer code, which decodes using the structure of the constituent outer code used in encoding (FIG. 3B). The input P(u;I) 66 is in this case driven by equal a priori probabilities for the individual coordinates. After multiple iterations with input 52 held constant, a decision is made as to what codeword was transmitted, at the P(u;O) output 70. Feedback provided by the extrinsic probabilities P(c;O) 72 is also input to a re-interleaver 74 which reorders the extrinsic probabilities consistent with the order at input 54 P(c:I) (and at the demodulator output), and the output of the re-interleaver forms an updated input P(u;I) 54 into the inner SISO decoder block 56 which begins another pass through the loop. In this manner, the iterative detector and decoder decodes and decides among competing potentially transmitted symbols; the minimum coordinate-wise Hamming distance between codewords in the codebook, which is preserved during the coordinate interleaving/de-interleaving process, and which is maximized at the transmitter by the choice of cosets, and sequences thereof, in the constituent encoder 38, 44, determines a diversity level beyond what is achievable when only a complex symbol-wise Hamming distance is maximized.

Figure 7:
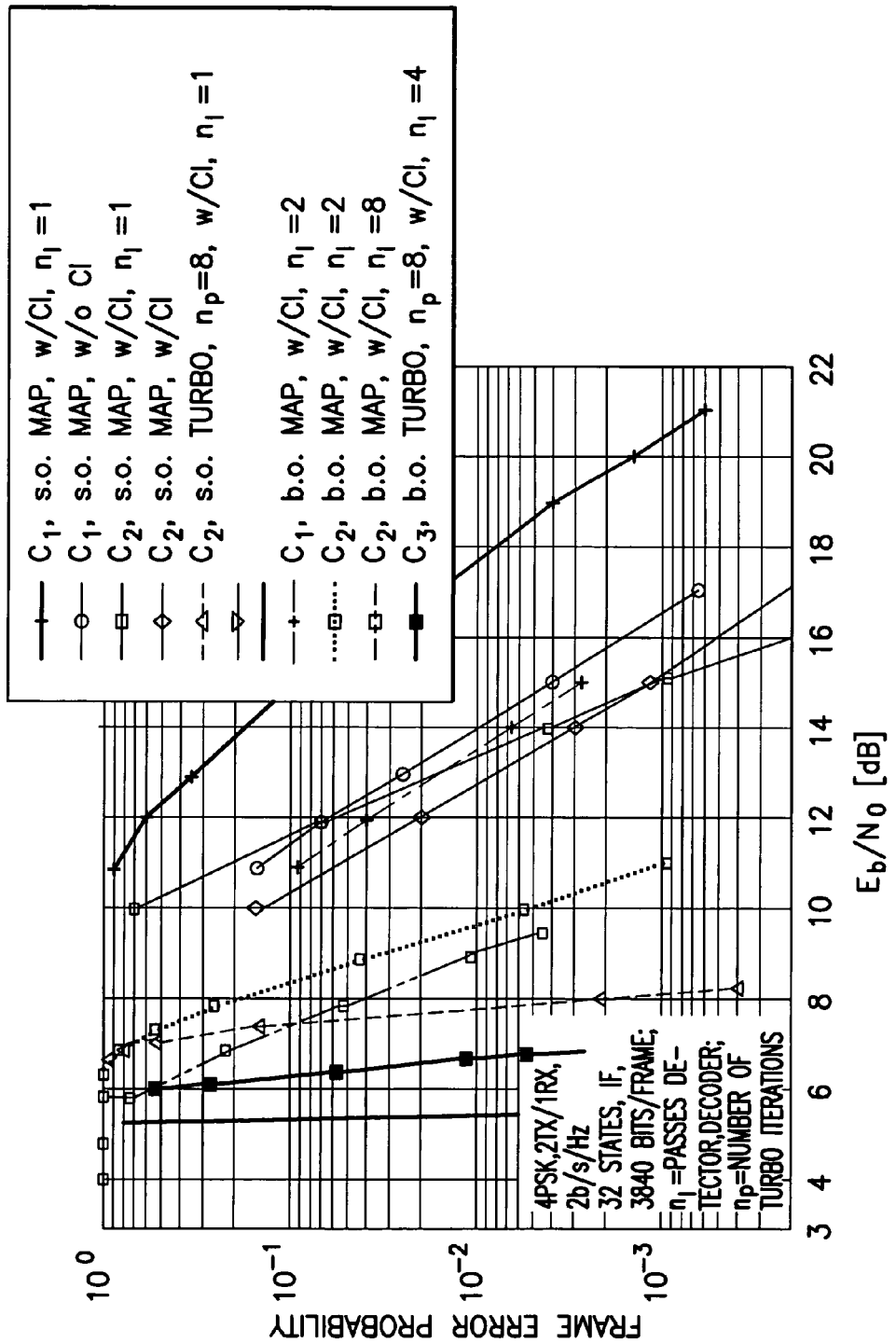
FIG. 7 shows performance results for several scenarios, including the presence or absence of coordinate interleaving, with parallel concatenation, and for comparison purposes for a constituent encoder (i.e., without parallel concatenation).

The detection and decoding apparatus to carry out the foregoing pertain to one constituent code used in the concatenation. In order to decode the concatenated scheme followed by coordinate interleaving, as represented in FIG. 5B, the approach in FIG. 4 must be modified to include the presence of multiple constituent encoders. This is illustrated in FIG. 7, for the exemplary scenario when the concatenated scheme is a parallel concatenation of two systematic and recursive constituent codes for jointly encoding across a plurality of transmit antennas.

Regarding the third bullet above, it is possible to: (1) construct concatenations of recursive, systematic, signal-space codes for transmission via multiple antennas in such a way as to enable iterative detection and decoding, (2) accommodate coordinate interleaving, and (3) avoid separating coding from modulation (as in bit-interleaved coded modulation).

In one embodiment, a method according to the invention preferably relies on interleaving the coordinates of the complex values to be transmitted over the fading channel(s), rather than interleaving the encoder's output (coded bits/symbols) prior to mapping them to the modulator's constellation points.

It is an important distinction from the prior art of bit-interleaved coded modulation, that the codes involved in the present invention are signal-space codes (information bits are encoded by the encoder directly into channel alphabet symbols, e.g. complex values). Those skilled in the art are aware that the redundancy step and the modulation step are combined in a signal-space code by virtue of the code's construction, so that there is no way of inserting an interleaver between the encoding step (redundancy) and the modulation step while preserving the signal space encoding nature. This means that, in general, one cannot implement bit interleaved coded modulation with a signal space code.

Regarding the receiver method and apparatus for a transmitter like in FIG. 5B, the following are true:
1. The apparatus for detecting and decoding parallel concatenations of signal-space codes for transmissions via multiple antennas, capable of achieving full-rate in the presence of coordinate interleaving, benefits from iterations between detector and decoder. These iterations naturally account for the hybrid nature of the parallel-serial concatenation induced by code concatenation and by the coordinate interleaver—possibly across transmit antennas—while circumventing the burden placed by the presence of the latter on detection;
2. Both the front-end detection and decoding operations can be successfully, and advantageously, treated as a posteriori probability (APP) calculations, with all the sub-optimal variants thereof (e.g., additive versions of the APP algorithm) that are capable of lowering the receiver's complexity;
3. In order for the serial iterations to be successful, the parallel iterations should be capable of providing extrinsic information on individual coordinates, rather than blocks of coordinates (as many as there participate in a trellis transition); and
4. It is desirable, although not mandatory, to use as many receive antennas as there are transmit antennas, in order to counter the effects of the finite modulation alphabet on mutual information, and thereby achieve performance near the capacity of pure coded modulation.

As previously noted, in general, coordinate interleaving schemes are different from bit-interleaved coded modulation schemes and do not preclude the concept of coded modulation (induced via signal-space coding); this is so because coordinate interleaving operates on the real coordinates of the complex values from the complex modulator alphabet, rather than operating on coded bits prior to the modulator. Moreover, the interleaving practiced in a bit-interleaved coded modulation scheme is such that all bits mapped to a channel symbol are affected by the same fade.

The coordinate interleaving approach achieves similar benefits as bit-interleaved coded modulation, but avoids the less understood problem of efficiently mapping coded bits/symbols to a complex constellation. The differences between the two schemes are even more obvious when the modulation constellations on the individual transmit antennas are larger than 4PSK.

Another potential advantage—and, at the same time, qualitative difference—is that when coordinate interleaving is used with a signal space code (or concatenation thereof) the size of a coordinate interleaver depends only on the number of transmit antennas, but not on the modulator constellation size; by comparison, the bit interleaver in a bit-interleaved coded modulation scheme must adapt its size with the modulator constellation size.

As the modulator constellation size is increased, the coordinate interleaving scheme is expected to be less and less impacted by fades (from a mutual information perspective) than bit-interleaved coded modulation.

While iterations that involve the demodulator are not excluded in bit-interleaved coded modulation when the number of transmit antennas exceeds one (cross-antenna interference), the purpose of iterations would not be to circumvent maximum likelihood demodulation, but rather to counter cross-antenna interference.

Two ways of constructing a parallel concatenation of two signal-space space-time encoders are illustrated in FIG. 5, with a parallel concatenated transmit diversity (PCTD) encoder with rate ⅓ and (a) symbol-wise or (b) bit-wise turbo interleaving (alternatively referred to as information interleaving). Other rates can be obtained by puncturing and/or repetition. The constituent space-time codes are systematic, recursive signal-space codes, preferably over a lattice superconstellation, and designed so as to verify the equal eigenvalue criterion (EEC). The input consists of information bits.

In FIG. 5a, the data enter serially through module 100 that groups the serial data into parallel blocks of k bits. The grouped data enter in the first constituent encoder 110 that transforms the input data into symbols selected from a possibly multidimensional constellation, thereby performing encoding in signal space.

A symbol wise interleaver 115 accepts the parallel blocks of k bits and interleaves (permutes) them; i.e. two initially consecutive blocks enter the second constituent encoder 110' at non-consecutive times. Interleaving involves accumulating all k-bit symbols (see above) in a terminated frame, then permuting over the whole frame (which implies some delay, depending on the hardware implementation). What is being interleaved in this case are symbols (groups of k bits), i.e. the information interleaver's granularity is a k-bit symbol. A terminated frame is a frame where tail input symbols are forced at the end of the block of information symbols that form a frame, the tail symbols being such as to insure that after an additional small number of transitions, the state of the encoder becomes a known, agreed upon state, e.g., 0. The block 115 is the information interleaver (well known in the art, characteristic of any turbo code, in particular parallel concatenated code), while module 120 is the coordinate interleaver; there are, thereby, two levels of interleaving. The encoder 110', identical to or different from encoder 110, performs the same function of encoding in signal space (i.e., it is a signal space encoder for multiple antennas). Preferably, too, a constituent signal space encoder used by this method and apparatus is programmed to operate so as to insure that the complex sequences resulting from encoding and modulation are defined so as to obey an equal eigenvalue criterion, while maximizing a minimum coordinate-wise Hamming distance, and/or a minimum Euclidean distance between different codewords. The versions of the coded sequence obtained after puncturing and repetition are complementary instantiations of the turbo encoded codeword, and for that reason the combination of coordinate interleaving, puncturing and repetition can be referred to as a quasi-complementary turbo code (QCTC) interleaver, denoted $\pi_{QCTC}$.

The coordinates present in the three data streams of encoded symbols, X and Y, Y' (systematic part from the first constituent encoder, and parity check parts from both constituent encoders) are collected (see FIG. 2) during a codeword, or frame, and enter unit 120, which performs coordinate puncturing, and/or repetition, and interleaving on the coordinates collected from at least the streams X and Y, Y'. Note that X' is not transmitted (typical of parallel concatenated codes, or turbo codes). Puncturing means that some of the coordinates associated with the collection of all complex symbols generated by the encoder's operation during a complete frame are deliberately not transmitted, in order to vary the overall code rate above the rate of the parallel concatenation. Likewise repetition of some coordinates can be used to vary the overall code rate below the rate of the parallel concatenation. Varying the overall code rate means varying the overall spectral efficiency.

On the right, block 120 accepts as input the streams of X, Y, and Y' from blocks 110 and 110', and collects the coordinates of all of the multidimensional constellation symbols that were encoded in blocks 110 and 110', and interleaves the coordinates, possibly according to an additional predefined grouping as X, Y, Yp (illustrated in FIG. 2) or any other arrangement. Module 120 performs either puncturing or repetition depending on whether the overall parallel concatenation is desired to have a rate above or below ⅓ (⅓ corresponds to no repetition and no puncturing). The output is then passed to the transmit antennas.

The other approach, illustrated in FIG. 5b, accommodates bit-wise turbo (information) interleaving, which has several significant advantages; in particular it allows parallel iterations at the receiver to be capable of providing extrinsic information on individual coordinates, rather than blocks of as many coordinates as participate in a trellis transition. The bit wise turbo (information) interleaving of block 117 simply interleaves all bits in a frame, with a granularity of one bit (finer than a symbol, which consists of k bits). As before, encoder 110' will accept at its input blocks of k interleaved bits at a time.

In both cases of FIGS. 5a and 5b, coordinate interleaving in block 120 can act on the output (channel alphabet symbols, i.e. complex values) of the signal-space concatenated code from units 110 and 110'; also, puncturing can be used on coordinates. In the exemplary implementation of FIG. 5, the constituent codes should preferably be systematic and recursive as signal-space codes (as is known in the art), and, in addition, (1) have as large as possible a minimum coordinate-wise Hamming distance between codewords, as well as (2) verify the equal eigenvalue criterion, and (3) have as large as possible a minimum Euclidean distance between codewords.

Other desirable feature, when possible to design into the forward encoding scheme, is geometrical uniformity for a constituent code.

Figure 6:
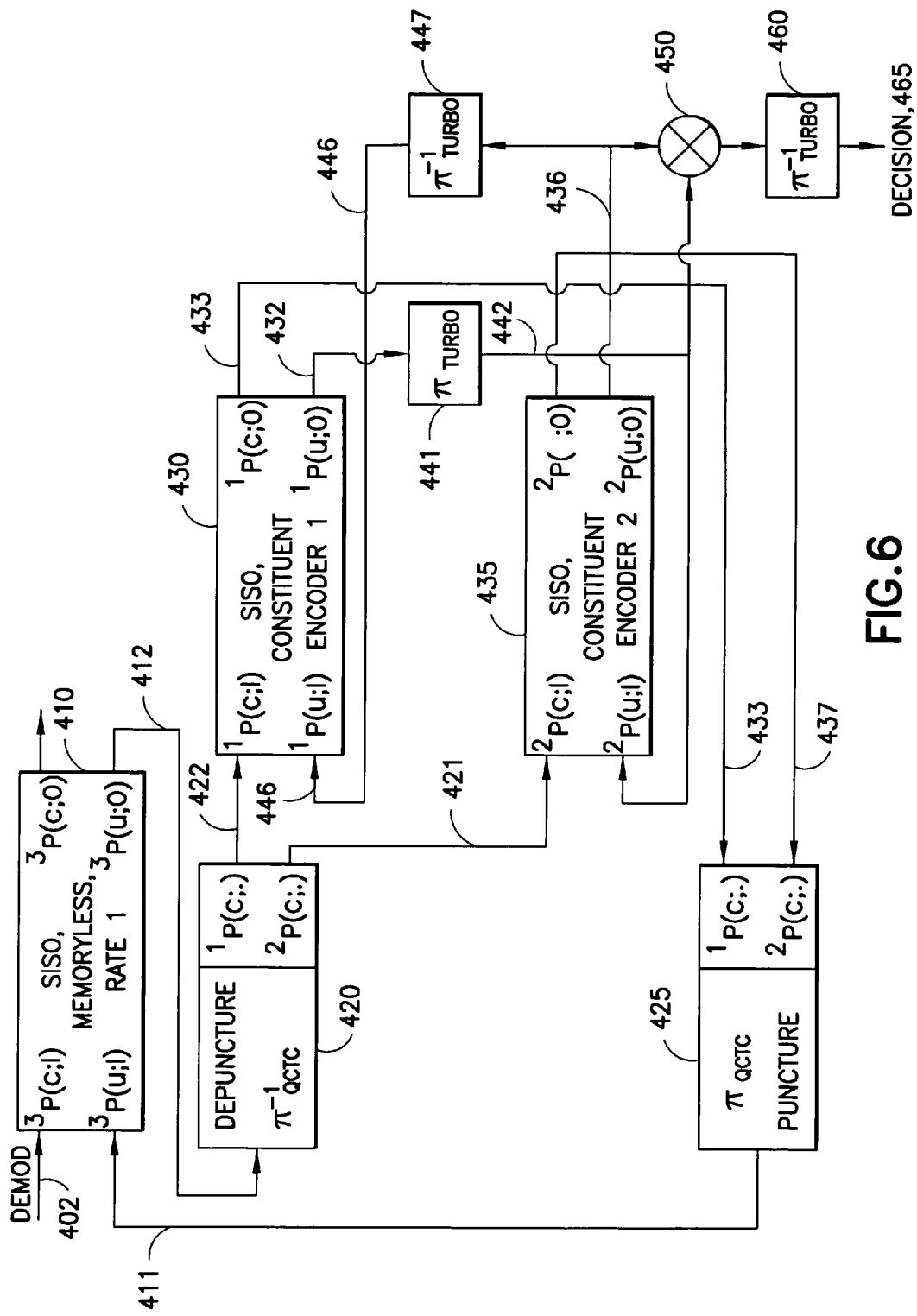
FIG. 6 shows a portion of an iterative detector and decoder for a parallel concatenation of two constituent encoders as assumed in FIG. 1.

Finally, an exemplary hybrid implementation of a decoder for the fully bit-oriented (b.o.) approach [bit-wise information (turbo) interleaving, coordinate-oriented SISO MAP] is shown in FIG. 6. This allows for iterations between detector and decoder, whereby the latter is treated as an APP calculator, and is capable of supplying extrinsic information for each individual coordinate involved in coordinate interleaving.

On the upper left, data arrive from the demodulator on line 402—e.g. in the form of joint maximum likelihood probabilities for the symbols from all transmit antennas, which are being simultaneously observed by each of the receive antennas. To be more specific, assume for simplicity a flat Rayleigh fading channel (any resolvable path in a frequency selective fading channel is a flat Rayleigh process); clearly, the symbols transmitted from all transmit antennas arrive at each receive antenna weighted by the respective (flat fading) channel coefficients. For each receive antenna, and during each channel use (complex symbol epoch), the detector computes, at its front end, the joint maximum likelihood probabilities for the symbols from all transmit antennas, which are being simultaneously observed by that receive antenna during one use (observation) of the MIMO channel. The collection of such joint probabilities from all receive antennas, over all channel uses in a frame, constitute the detector's contribution on line 402. Naturally, in the presence of puncturing, the detector replaces the joint probabilities for the missing (punctured, i.e. non-transmitted) coordinates by equal probabilities. The other input to module 410 represents the a priori probabilities associated with the input to the inner code from FIG. 3B. Again, any missing (punctured) coordinates are replaced by equal probabilities, but this is only necessary in the first iteration of module 410; afterwards, the a priori information becomes available in the form of extrinsic information from the soft input soft output (SISO) modules 430 and 435, corresponding to the outer code 44 in FIG. 3B. Unit 410 is a soft input soft output (SISO) a posteriori probability (APP) calculation module. A notation convention in this Figure is that the inputs and outputs are labeled (I;J) where I may be 'c' for coded and 'u' for uncoded datum types and J may be I or O for input or output. In recognition of the serial concatenated view of FIG. 3B, unit 410 uses the output of the demodulator, at line 402, in order to derive extrinsic information about the observed, interleaved coordinates, thereby 'decoding' the inner code (module 48 in FIG. 3B) in an iterative manner—just as was illustrated in FIG. 4; the difference between the rest of FIG. 7 and FIG. 4 is that the former incorporates the necessary elements to account for (1) the presence of a parallel concatenated implementation for the outer code (44 in FIG. 3B, or 110 and 110' in FIG. 5B)—rather than a stand alone constituent code, which was assumed in the explanation of FIG. 3B, as well as (2) repetition and/or puncturing (only latter was considered in this exemplary implementation). All the units in this Figure are coordinate-oriented, rather than revolving around groups of coordinates.

Output 412 of unit 410 represents the extrinsic information for the input symbols to the degenerated (or fictitious, or auxiliary, or virtual) inner code; the input 411 represents the a priori probabilities associated with the input to the inner code 48 from FIG. 3B. During the first iteration 411 is set to all equal probabilities, and during the later (serial) iterations input 411 receives, via module 425, the extrinsic probabilities from the soft input soft output (SISO) modules 430 and 435 corresponding to the concatenated outer code (110 and 110' in FIG. 5B). Output 412 of unit 410 goes to the depuncture unit 420 that performs the inverse operation of unit 120 in FIG. 5 or unit 46 in FIG. 3B. Naturally, depuncturing addresses both constituent codes, hence the two outputs 422 and 421. The two parallel outputs 422 and 421 go to the SISO modules (430 and 435) corresponding to the constituent encoders 110 and 110' that encode the input data. Each of these SISO modules 430, 435, operate in the manner known in the prior art. For example, unit 430 has an input 422 for the a priori information associated with the coded symbols, and another input 446 for the a priori information associated with the uncoded (information) symbols. Input and output may refer to either bits or coordinates, as necessary. During iterations, the values applied to input 446 are supplied in the form of relevant extrinsic information, from the SISO module 435 corresponding to the other constituent code, after proper information deinterleaving steps. In particular, 446 is fed the extrinsic information from output 436 of SISO module 435, after information deinterleaving, while 422 is fed the extrinsic information retrieved from 412, which is coordinate interleaved and depunctured in unit 420, and presented at the relevant output 422 of unit 420. After two parallel iterations between units 430 and 435, the extrinsic information they generate is collected at outputs 433 and 437, assembled in unit 425, coordinate interleaved, and fed as a priori information to SISO module 410, for another serial iteration.

The feedback loop contributes to an iteration process that refines, via iterations, the soft information about the information bits, thereby iteratively performing demodulation (or detection) and decoding.

After sufficient iterations, the outputs of units 430 and 435 that hold extrinsic information about the uncoded (information) bits are combined in unit 450 to produce a decision as to which codeword had been used in the transmitter, and what information bits had been transmitted.

The quality of this decision about the information bits is improved according to the invention as a result of the combined effect of enforcing the equal eigenvalue criterion (structure of code difference matrices), maximizing the minimum Euclidean distance, maximizing the minimum coordinate-wise Hamming distance, performing coordinate interleaving, and using systematic and recursive, signal space, constituent space-time codes, possibly with additional structure such as geometrical uniformity.

Figure 8:
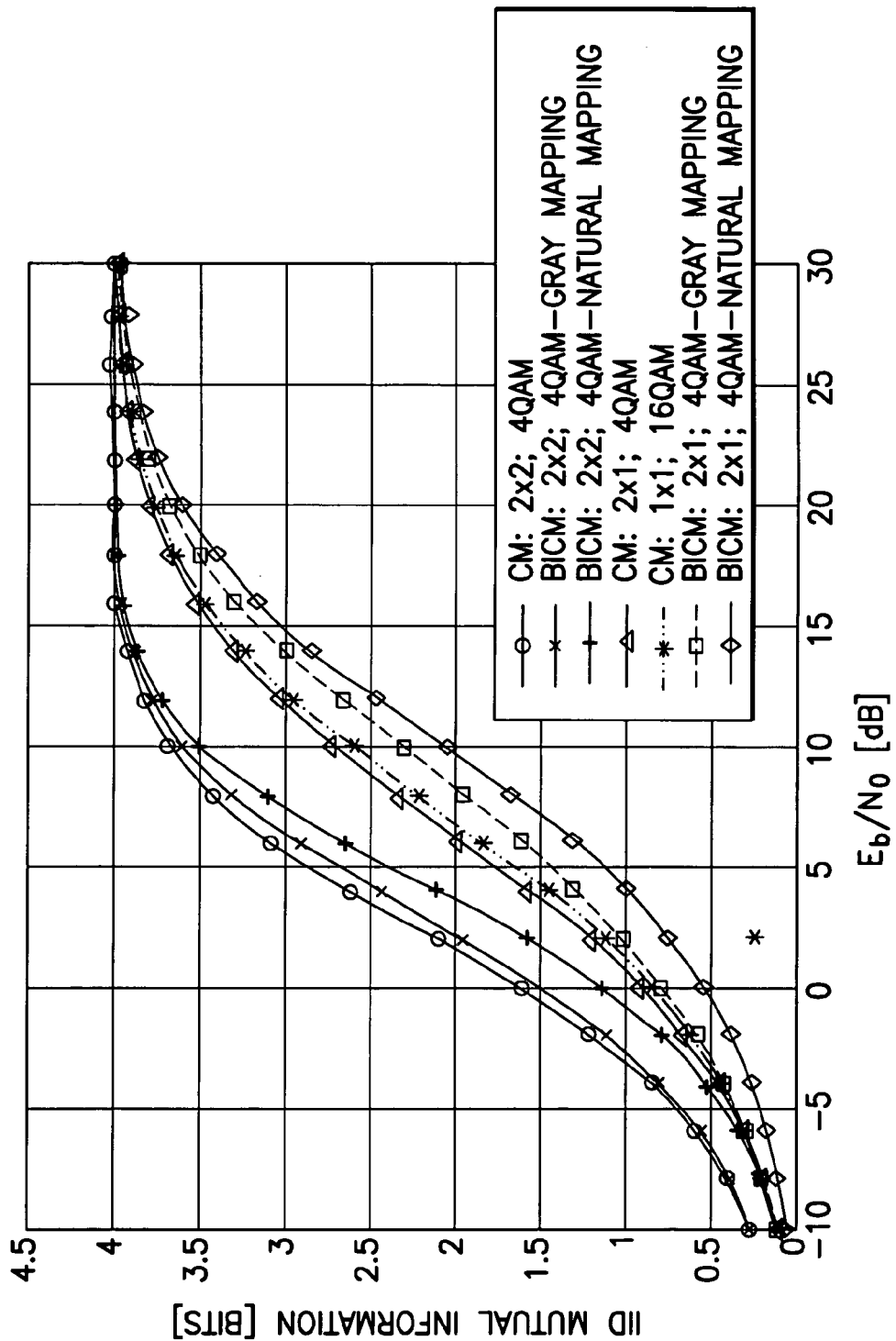
FIG. 8 shows information theoretic limits with one or two transmit and one or two receive antennas; this is used to evaluate the efficiency of the method and apparatus using a parallel concatenation of signal-space codes for jointly encoding across multiple transmit antennas, and employing coordinate interleaving.

The curves in FIG. 8 indicate a fundamental difference between the information rate limits in scenarios that involve finite channel alphabets, and more than one transmit/receive antennas—even for the Gray mapping case, which in G. Caire, G. Taricco, and E. Biglieri, "*Bit-Interleaved Coded Modulation*," [IEEE Trans. Inform. Theory, vol. 44, No. 3, pp. 927-946, May 1998] is conjectured to maximize the mutual information of bit-interleaved schemes. It is possible to view coded modulation as a concatenation between a code and a mapper, provided that the mapper is derived from some set partitioning labeling. Thereby, in the particular case of using 4PSK constellations on the individual transmit antennas, and only then, bit-interleaved coded modulation and coordinate interleaving of a coset signal-space code are equivalent—since exactly one coded bit is mapped to one coordinate whenever coding is viewed as separated from modulation (regardless of whether the modulation mapper is defined via some set partitioning labeling, or not). While it can be rigorously proven that coordinate interleaving does not change the ergodic channel capacity, the model in G. Caire et al. (above) predicts a gap between mutual information curves for bit-interleaved coded modulation relative to pure coded modulation (due, in part, to the finite size channel alphabet;

see, however, the footnote in G. Caire et al., p. 931). The relevant mutual information curves are illustrated in FIG. 8; with L=2 transmit antennas and M=1 receive antenna, the gap is significant, but narrows when M=2.

Note that in coordinate interleaving schemes the role of iterating as in FIG. 6 is to circumvent maximum likelihood detection; note that the presence of an interleaver does not always preclude maximum likelihood—e.g., a symbol interleaver in a coded modulation scheme does not.

Specifically, FIG. 8 plots the mutual information for coded modulation vs. bit-interleaved coded modulation G. Caire et al., with finite 4PSK modulation alphabets, two transmit antennas and either 1 or 2 receive antennas, and memoryless fading channels. The mutual information was computed based on the model and approach from G. Caire et al. using the computational tool described in D. Arnold et al. (above), based on the BCJR algorithm.

FIG. 7 illustrates the effect of coordinate interleaving on stand alone constituent codes, and on the parallel concatenated codes from FIGS. 5A, 5B. Several constituent codes were used to obtain the curves in FIG. 7. The relevant curve is the one with curve with solid square markers, as it represents the concatenated coded scheme with bit oriented information interleaving followed by coordinate interleaving (see FIG. 5B).

The spectral efficiency is 2 bits/s/Hz, there are 3840 information bits per frame, all codes represented in the figure have 32 states, and the fading is flat, independent from channel use to channel use; L=2, M=1 or M=2. The classification 's.o.\ turbo' means that both the turbo interleaver and the SISO APP algorithm are symbol-oriented; similarly, the classification 'b.o.\ turbo' means that both the turbo interleaver and the SISO APP algorithm are bit-oriented. (If the constellation used on each transmit antenna were not 4PSK, a more accurate classification would be coordinate-oriented.) Likewise, the classification 's.o.\ MAP' means that there is no parallel concatenation—i.e., the code is evaluated stand-alone, with or without coordinate interleaving—and the SISO APP algorithm is symbol-oriented; similarly for 'b.o.\ MAP'. $n_P$, $n_t$ represent the numbers of iterations in the parallel concatenation, and respectively of passes between detection and decoding; one pass means that no iterations between detection and decoding are performed, i.e. once the SISO APP computations are performed a decision is made in favor of the symbol with the MAP probability. Finally, $n_H$ represents the number of hybrid iterations—complete passes, serially then parallel, per FIG. 6.

Specifically, FIG. 7 shows simulation results in various independent, flat fading, MIMO channel scenarios: present or absent coordinate interleaving (CI), symbol-oriented (s.o.) or bit-oriented (b.o.) APP, stand-alone (MAP) or turbo, L=2 TX antennas and M=1 or M=2 RX antennas. $n_P$ is the number of iterations in the parallel concatenation; in the absence of parallel concatenation, $n_S$ is the number of passes between detection and decoding; one pass means that no iterations between detection and decoding are performed, i.e. once the SISO APP computations are completed a decision is made in favor of the MAP probability. With parallel concatenation, a hybrid iteration is a complete pass, serially then parallel, per FIG. 6. Mutual information limits at 2 bits/s/Hz from FIG. 9 are shown for L=2 and M=1 or M=2.

The positioning—with respect to the mutual information limits—of the curves for fully bit-oriented, coordinate interleaved, parallel concatenation with M=1 and M=2 (filled square and triangle markers) seems consistent with (the gaps from) FIG. 8. Moreover, when M=2, PCTD performs at least as well as an irregular low density parity check code reported in [16]—on equal grounds, C. Jones, C. Kose, T. Tian, R. Wesel, "*The robustness of Low-Density Parity-Check Codes in Quasi-Static and Fast Rayleigh Fading Channels*," [CONTRIBUTION IEEE 802.11-03/0532-00-HTSG TO 802.11 STANDARDIZATION GROUP, July 2003], reports that for a frame size of 4096 bits (slight advantage over 3840 used in FIG. 8) their irregular LDPC code has a bit error probability of $10^{-4}$ at bit SNR of 0.6 dB. With respect to the mutual information limit for coded modulation, the filled triangle curve is less than 1.8 dB away, compared to approx. 3.5 dB for VBLAST at 10% frame error probability (see S. L. Ariyavisitakul, "*Turbo space-time processing to improve wireless channel capacity*," PROC. ICC 2000, vol. 3, pp. 18-22, June 2000; frame size in that reference is, however, only 400 bits; a slight degradation occurs as frame size decreases, usually below 1 dB).

For comparison with the prior art from Youjian Liu, M. P. Fitz, O. Y. Takeshita, "*Full rate space-time turbo codes*," [IEEE J. SELECT. AREAS COMMUN., vol. 19, pp. 969-980, May 2001], note that the frame size in that reference is only 260 bits; that also makes the decoding complexity tractable during belief propagation. If the best curve in FIG. 7 is compared with that for independent fading from the Liu et al. reference, it will become apparent that the former has a much better slope and crosses the latter at approximately 0.02 frame error rate—while using a relatively simple decoding approach based on soft-input soft-output APP modules (which can be further simplified, say, via max-log algorithm). Some additional 0.3 dB improvement can be achieved with the exemplary implementation if increasing the number of iterations is deemed acceptable.

Finally, when an unrotated 4PSK constellation is used on both transmit antennas, a newer constituent code, optimized with respect to the equal eigenvalue criterion, minimum coordinate-wise Hamming distance between codewords, and minimum Euclidean distance between codewords, and not represented in FIG. 7, showed an additional 0.4 dB improvement in the curve with solid square markers. This places the performance of the invented scheme within 1 dB of the information theoretic limit (see FIG. 8), and further strengthens the invention.

What is claimed is:

1. A method comprising:
    encoding input data over at least two pipes by a concatenation of at least two constituent signal-space encoders, in which each constituent encoder is used to generate, in response to said input data, a sequence of symbols from a channel alphabet having at least one dimension, each symbol of said channel alphabet comprising at least one complex symbol having real and imaginary coordinates;
    interleaving the coordinates of said sequence of channel alphabet symbols into codewords that comprise frames;
    at least one of puncturing and repeating at least some of the sequence of symbols resulting from concatenation and interleaving; and
    transmitting the frames using at least two channels,
    where the real coordinate and imaginary coordinate for each complex symbol are transmitted via different channels.

2. The method according to claim 1, in which each constituent signal-space encoder operates to:
    maximize a minimum coordinate-wise Hamming distance between members of all valid pairs of sequences of symbols;
    maximize a minimum Euclidean distance between members of all valid pairs of different codewords; and
    obey an equal eigenvalue criterion.

3. The method according to claim 1, in which said constituent signal-space encoders each comprise a trellis encoder.

4. The method according to claim 1, further comprising interleaving a bit stream input into each constituent signal-space encoder such that each constituent signal space encoder operates on a different stream of input bits.

5. The method according to claim 1, further comprising interleaving a bit stream input into each constituent signal-space encoder except one of said signal-space encoders, such that all constituent signal space encoders operate on a different stream of input information bits.

6. The method according to claim 1, further comprising, prior to encoding input data and for each constituent signal-space encoder:
   parsing an input data stream into groups of k bits, where k is an integer; and
   interleaving said groups of k bits,
   whereby each encoder operates on a different sequence of groups of input bits.

7. The method according to claim 1, further comprising, prior to encoding input data and for each constituent signal-space encoder except one:
   parsing an input data stream into groups of k bits; and
   interleaving said groups of k bits,
   whereby each encoder operates on a different sequence of groups of input bits.

8. A method comprising:
   demodulating received data characterized by a concatenated and coordinate-interleaved structure, where the data has been received over multiple channels;
   passing the demodulated data through a first decoder to form an intermediate output;
   deinterleaving coordinates of the intermediate output to generate a plurality of streams of extrinsic information pertaining to the deinterleaved coordinates;
   inputting into each of a plurality of decoders a feedback stream from another of said plurality of decoders and at least one of said plurality of streams; and
   permuting said feedback streams, using a quasi-complementary turbo code interleaver, to derive compatible feedback signals,
   where a real coordinate and an imaginary coordinate for a complex symbol in the received data are received via different channels.

9. The method according to claim 8 wherein permuting comprises, for at least one iteration, the compatible feedback signals derive from extrinsic probabilities corresponding to a concatenated outer code.

10. The method according to claim 8 wherein permuting comprises, for only a first iteration, the first decoder operates to replace joint probabilities for punctured elements with equal probabilities, said elements comprising real coordinates of complex symbols of the received data.

11. An apparatus comprising:
   a joint encoder comprising at least two constituent signal-space encoders, said joint encoder configured to encode input data over at least two pipes by concatenating outputs from the at least two constituent signal-space encoders, in which each said constituent encoder is used to generate, in response to said input data, a sequence of symbols from a channel alphabet having at least one dimension, each symbol of said channel alphabet comprising at least one complex symbol having real and imaginary coordinates;
   a coordinate interleaver having an input coupled to an output of the joint encoder configured to interleave the coordinates of said sequence of channel alphabet symbols; and
   a router having an input coupled to an output of the coordinate interleaver configured to distribute the interleaved coordinates from said sequence of channel alphabet symbols to at least two channels;
   where the coordinate interleaver is configured to at least one of puncture and repeat at least some of the sequence of symbols,
   where the real coordinate and imaginary coordinate for each complex symbol are transmitted via different channels.

12. The apparatus of claim 11, wherein each constituent signal-space encoder is adapted to:
   maximize a minimum coordinate-wise Hamming distance between members of all valid pairs of sequences of symbols;
   maximize a minimum Euclidean distance between members of all valid pairs of different codewords that are to be output from the coordinate interleaver; and
   obey an equal eigenvalue criterion.

13. The apparatus of claim 11, wherein said constituent signal-space encoders each comprise a trellis encoder.

14. The apparatus of claim 11, further comprising at least two bit interleavers, each disposed such that each signal-space encoder has an input coupled to an output of a bit interleaver.

15. The apparatus of claim 11, further comprising at least one bit interleaver, each disposed such that each signal-space encoder save one has an input coupled to an output of a bit interleaver.

16. The apparatus of claim 11, where for each constituent signal-space encoder, the coordinate interleaver is configured:
   to parse an input data stream into groups of k bits; and
   to interleave said groups of k bits,
   whereby each signal-space encoder receives as input a different sequence of bits.

17. The apparatus of claim 11, further comprising, where for each constituent signal-space encoder save one, the coordinate interleaver is configured:
   to parse an input data stream into groups of k bits; and
   to interleave said groups of k bits,
   whereby each signal-space encoder receives as input a different sequence of bits.

18. An apparatus comprising:
   a demodulator configured to receive data characterized by a concatenated and coordinate-interleaved structure, where the data has been received over multiple channels;
   a serial decoder having as inputs an output of the demodulator and a serial feedback, said serial decoder configured to decode an inner code;
   at least two parallel decoders each having a first input coupled to an output of the serial decoder and a feedback input coupled to a feedback output of another parallel decoder, each parallel decoder operating to deinterleave coordinates of its respective first input and decode an outer code thereof, and each further comprising a second output; and
   a quasi-complementary turbo code calculating module having inputs coupled to each of the second outputs of the parallel decoders and an output coupled to the serial feedback of the serial decoder, where a real coordinate and an imaginary coordinate for a complex symbol in the received data are received via different channels.

19. The apparatus of claim 18, wherein the serial decoder decodes the inner code by deriving extrinsic information about interleaved coordinates input thereto.

20. The apparatus of claim 18, wherein the receiver operates to permute decoding at the parallel decoders until compatible feedback signals are achieved that derive from extrinsic probabilities corresponding to a concatenated outer code.

21. The apparatus of claim 18, wherein the calculating module provides an equal probabilities result on its output at least until it receives a signal on each of its inputs.

22. An apparatus comprising:
   means for encoding and concatenating input data over at least two pipes by generating, from the input data, a sequence of channel alphabet symbols, each symbol comprising at least one complex symbol having real and imaginary coordinates;
   means for interleaving the coordinates of said sequence of symbols into codewords that each comprise a transmission frame and for at least one of puncturing and repeating at least some of the sequence of symbols; and
   means for transmitting the frames simultaneously using at least two channels,
   where the real coordinate and imaginary coordinate for each complex symbol are transmitted via different channels.

23. An apparatus comprising:
   means for receiving data over multiple channels, where the data is characterized by a concatenated and coordinate-interleaved structure;
   means for demodulating the received data;
   means for decoding an inner code of the demodulated received data using information about interleaved coordinates;
   means for deinterleaving coordinates that are output from the means for decoding an inner code;
   parallel means for decoding an outer code of the demodulated received data, each of said parallel means using a feedback from another of said parallel means for decoding an outer code; and
   means for determining extrinsic probabilities of an outer code of the received data from outputs of each of the parallel means and a quasi-complementary turbo code, said extrinsic probabilities provided as an output that is coupled to an input of the means for decoding an inner code,
   where a real coordinate and an imaginary coordinate for a complex symbol in the received data are received via different channels.

24. A non-transitory computer readable medium tangibly embodying computer readable instructions that are executed by a computer to perform actions comprising:
   encoding input data over at least two pipes by a concatenation of at least two constituent signal-space encoders, in which each constituent encoder is used to generate, in response to said input data, a sequence of symbols from a channel alphabet having at least one dimension, each symbol of said channel alphabet comprising at least one complex symbol having real and imaginary coordinates;
   interleaving the coordinates of said sequence of channel alphabet symbols into codewords that comprise transmission frames;
   at least one of puncturing and repeating at least some of the sequence of symbols resulting from concatenation and interleaving; and
   transmitting the frames using at least two channels,
   where the real coordinate and imaginary coordinate for each complex symbol are transmitted via different channels.

* * * * *